United States Patent
Yoon

(10) Patent No.: US 12,526,995 B2
(45) Date of Patent: Jan. 13, 2026

(54) 3D SEMICONDUCTOR DEVICE AND METHOD OF FABRICATING THE SAME

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 436 days.

(21) Appl. No.: 18/074,935

(22) Filed: Dec. 5, 2022

(65) Prior Publication Data

US 2024/0074185 A1  Feb. 29, 2024

(30) Foreign Application Priority Data

Aug. 26, 2022  (KR) .......................... 10-2022-0107545

(51) Int. Cl.
*H10B 43/27*  (2023.01)
*H10B 43/10*  (2023.01)

(52) U.S. Cl.
CPC ............. *H10B 43/27* (2023.02); *H10B 43/10* (2023.02)

(58) Field of Classification Search
CPC ................................ H10B 43/27; H10B 43/20
See application file for complete search history.

(56) References Cited

U.S. PATENT DOCUMENTS

2008/0246078 A1* 10/2008 Huo ................... H10D 30/6893
                                                                    977/774
2021/0296458 A1*  9/2021 Okada ................. H10D 64/037
2022/0367479 A1* 11/2022 Lee ......................... H10B 43/40

FOREIGN PATENT DOCUMENTS

| KR | 10-0855993 B1 | 9/2008 |
| KR | 10-1029614 B1 | 4/2011 |
| KR | 10-2020-0031177 A | 3/2020 |
| KR | 10-2201016 B1 | 1/2021 |
| KR | 10-2021-0025244 A | 3/2021 |

OTHER PUBLICATIONS

Office Action for Korean Patent Application No. 10-2022-0107545 issued by the Korean Patent Office on Nov. 27, 2025.

* cited by examiner

*Primary Examiner* — Christopher A Johnson
(74) *Attorney, Agent, or Firm* — IP & T GROUP LLP

(57) ABSTRACT

A 3D semiconductor device includes: a word line stack over a substrate; and a channel pillar vertically penetrating the word line stack. The word line stack includes a word line and an interlayer dielectric layer. The channel pillar includes: a central dielectric layer; a channel layer surrounding a side of the central dielectric layer; a tunneling dielectric layer having a cylinder shape surrounding a side of the channel layer; an inner charge trap layer surrounding a side of the tunneling dielectric layer; a ring-shaped outer charge trap layer surrounding a side of the inner charge trap layer; and a ring-shaped blocking dielectric layer surrounding a side of the outer charge trap layer. The word line and the blocking dielectric layer have substantially the same vertical thickness. The interlayer dielectric layer is in contact with upper and lower surfaces of the outer charge trap layer and the blocking dielectric layer.

20 Claims, 29 Drawing Sheets

3D SEMICONDUCTOR DEVICE AND METHOD OF FABRICATING THE SAME

CROSS-REFERENCE TO RELATED APPLICATIONS

The present application claims priority of Korean Patent Application No. 10-2022-0107545, filed on Aug. 26, 2022, which is incorporated herein by reference in its entirety.

BACKGROUND

1. Field

Exemplary embodiments of the present disclosure relate to a three-dimensional (3D) semiconductor device having confined charge trap layers, and a method of fabricating the same.

2. Description of the Related Art

A three-dimensional (3D) semiconductor device requires a charge trap layer with excellent retention.

SUMMARY

Embodiments of the present disclosure are directed to a three-dimensional (3D) semiconductor device having preferably, but not necessarily, low migration for excellent retention.

Embodiments of the present disclosure are directed to a method of fabricating a 3D semiconductor device having preferably, but not necessarily, low migration for excellent retention.

In accordance with one embodiment of the present disclosure, a three-dimensional (3D) semiconductor device includes: a word line stack over a substrate; and a channel pillar vertically penetrating the word line stack. The word line stack includes a word line and an interlayer dielectric layer. The channel pillars includes: a central dielectric layer; a cylinder-shaped channel layer surrounding a side surface of the central dielectric layer; a tunneling dielectric layer having a cylinder shape surrounding a side surface of the channel layer; an inner charge trap layer surrounding a side surface of the tunneling dielectric layer; a ring-shaped outer charge trap layer surrounding a side surface of the inner charge trap layer; and a ring-shaped blocking dielectric layer surrounding a side surface of the outer charge trap layer, and a vertical thickness of the word line is substantially the same as a vertical thickness of the blocking dielectric layer. The interlayer dielectric layer is in contact with upper and lower surfaces of the outer charge trap layer and is in contact with upper and lower surfaces of the blocking dielectric layer.

In accordance with another embodiment of the present disclosure, a 3D semiconductor device includes: a word line stack over a substrate; and a channel pillar vertically penetrating the word line stack. The word line stack includes a plurality of word lines and a plurality of interlayer dielectric layers that are stacked alternately.

The channel pillar includes: a central dielectric layer; a cylinder-shaped channel layer surrounding a side surface of the central dielectric layer; a cylinder-shaped tunneling dielectric layer surrounding a side surface of the channel layer; a cylinder-shaped inner charge trap layer surrounding a side surface of the tunneling dielectric layer; ring-shaped outer charge trap layer surrounding a side surface of the inner charge trap layer; and ring-shaped blocking dielectric layers surrounding side surfaces of the outer charge trap layers. The vertical thicknesses of each of the word lines, each of the blocking dielectric layers, and each of the outer charge trap layers are substantially the same. Each of the interlayer dielectric layers is in contact with upper and lower surfaces of the outer charge trap layer and is in contact with the blocking dielectric layer. Each of the outer charge trap layers includes at least one of $ZrO_x$, $HfO_x$, HfON, $Al_2O_3$, $Y_2O_3$, $LaO_x$, $SrO_x$, $TiO_x$, IGZO (Indium Gallium Zinc Oxide), ZnO, ZTO (zinc-tin-oxide), $Ga_2O_3$, and $SnO_2$. The inner charge trap layer includes at least one of SiN, SiCN, SiBN, SiON, SiCON, and SiBCN.

In accordance with another embodiment of the present disclosure, a 3D semiconductor device includes: a word line stack over a substrate; and a channel pillar vertically penetrating the word line stack. The word line stack includes a plurality of word lines and a plurality of interlayer dielectric layers that are stacked alternately. The channel pillar includes: a central dielectric layer; a cylinder-shaped channel layer surrounding a side surface of the central dielectric layer; a cylinder-shaped tunneling dielectric layer surrounding a side surface of the channel layer; ring-shaped inner charge trap layers surrounding a side surface of the tunneling dielectric layer; ring-shaped outer charge trap layers surrounding side surfaces of the inner charge trap layers; and ring-shaped blocking dielectric layers surrounding side surfaces of the outer charge trap layers. The vertical thicknesses of each of the word lines, each of the blocking dielectric layers, each of the outer charge trap layers and each of the inner charge trap layers are substantially the same. Each of the interlayer dielectric layers is in contact with upper and lower surfaces of the outer charge trap layer and is in contact with the blocking dielectric layer. Each of the outer charge trap layers and each of the inner charge trap layers include one of high-k materials, oxide semiconductor materials, and silicon nitride. The outer charge trap layers and the inner charge trap layers include different materials.

DETAILED DESCRIPTION

Figure 1:
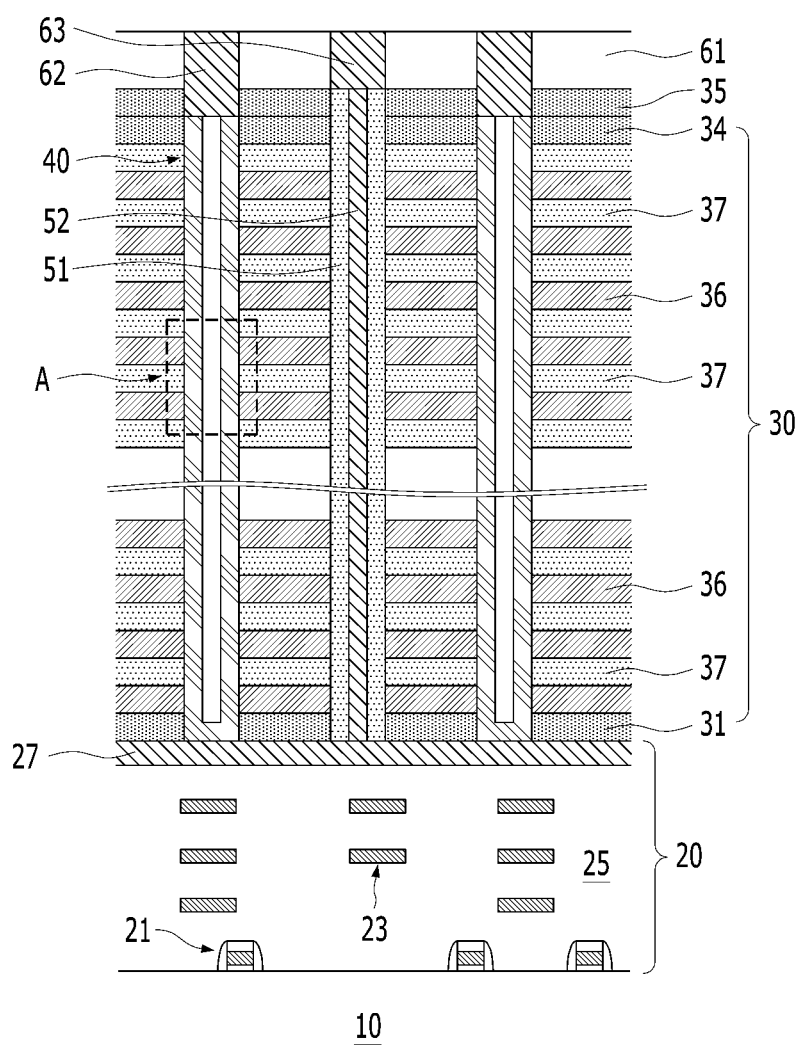
FIG. 1 is a longitudinal cross-sectional view schematically showing a three-dimensional semiconductor device in accordance with an embodiment of the present disclosure.

Embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also may refer to a case where a third layer exists between the first layer and the second layer or the substrate.

FIG. 1 is a longitudinal cross-sectional view schematically showing a three-dimensional semiconductor device in accordance with one embodiment of the present disclosure. Referring to FIG. 1, a three-dimensional (3D) semiconductor device in accordance with this embodiment of the present disclosure may include a logic circuit layer 20 positioned over a substrate 10, a word line stack 30 positioned over the logic circuit layer 20, and a channel pillar 40 vertically penetrating the word line stack 30. The 3D semiconductor device may further include a line dielectric layer 61, a channel contact plug 62, and a slit contact plug 63.

The substrate 10 may include a semiconducting material. For example, the substrate 10 may include one or more of a monocrystalline silicon wafer, an epitaxially grown silicon layer, a silicon-on-insulator (SOI), a compound semiconductor, or other semiconductor layers. The logic circuit layer 20 may include a transistor 21, a logic line 23, a logic dielectric layer 25, and a common electrode layer 27. The transistor 21 may include a gate electrode positioned over the substrate 10, and source/drain electrodes formed in the substrate 10. The logic line 23 may include multiple metal layers. The logic dielectric layer 25 may surround the transistor 21 and the logic line 23 to insulate them from each other. The common electrode layer 27 may be positioned on top of the logic circuit layer 20. The common electrode layer 27 may include for example polysilicon doped with N-type ions, a metal such as tungsten (W), a metal compound such as titanium nitride (TiN), or a metal silicide (or a combination thereof). From the perspective of a top view, the common electrode layer 27 may have a rail shape or a plate shape.

The word line stack 30 may include a bottom dielectric layer 31, a top dielectric layer 34, a buffer dielectric layer 35 over the top dielectric layer 34, and a plurality of word lines 36 and a plurality of interlayer dielectric layers 37 that are alternately stacked between the bottom dielectric layer 31 and the top dielectric layer 34. The bottom dielectric layer 31, the top dielectric layer 34, and the buffer dielectric layer 35 may include a dielectric material such as silicon oxide ($SiO_2$). The interlayer dielectric layers 37 may include a nitride material having a higher dielectric constant than silicon oxide ($SiO_2$), such as for example SiN, SiBN, SiCN, SiON, SiCON, or SiBCN (or a combination thereof). The word lines 36 may include a conductor. For example, the word lines 36 may include N-doped polycrystalline silicon. According to one embodiment of the present disclosure, the word lines 36 may include at least one of a metal, a metal nitride, a metal silicide, and a metal alloy or a combination thereof.

The channel pillar 40 will be described in detail with reference to FIGS. 2A to 2F.

A slit dielectric layer 51 may insulate the word lines 36 in a horizontal direction from a slit via plug 52. The slit dielectric layer 51 may include an insulating material such as for example silicon oxide ($SiO_2$), silicon carbon oxide (SiCO), or silicon carbon nitride (SiCN) (or a combination thereof). The slit via plug 52 may vertically penetrate the slit dielectric layer 51 to be electrically connected at a base of word line stack 30 to the common electrode layer 27. The slit via plug 52 may include a conductor such as a metal.

The line dielectric layer 61 may be formed over the word line stack 30 and the channel pillar 40. The channel contact plug 62 may penetrate the line dielectric layer 61 to be electrically connected to the channel pillar 40. A slit contact plug 63 may vertically penetrate the line dielectric layer 61 to electrically connect to the slit via plug 52. The line dielectric layer 61 may include silicon oxide ($SiO_2$). The channel contact plug 62 and the slit contact plug 63 may include a metal such as tungsten (W) or a metal nitride such as titanium nitride (TiN) or a combination thereof.

Figure 2A:
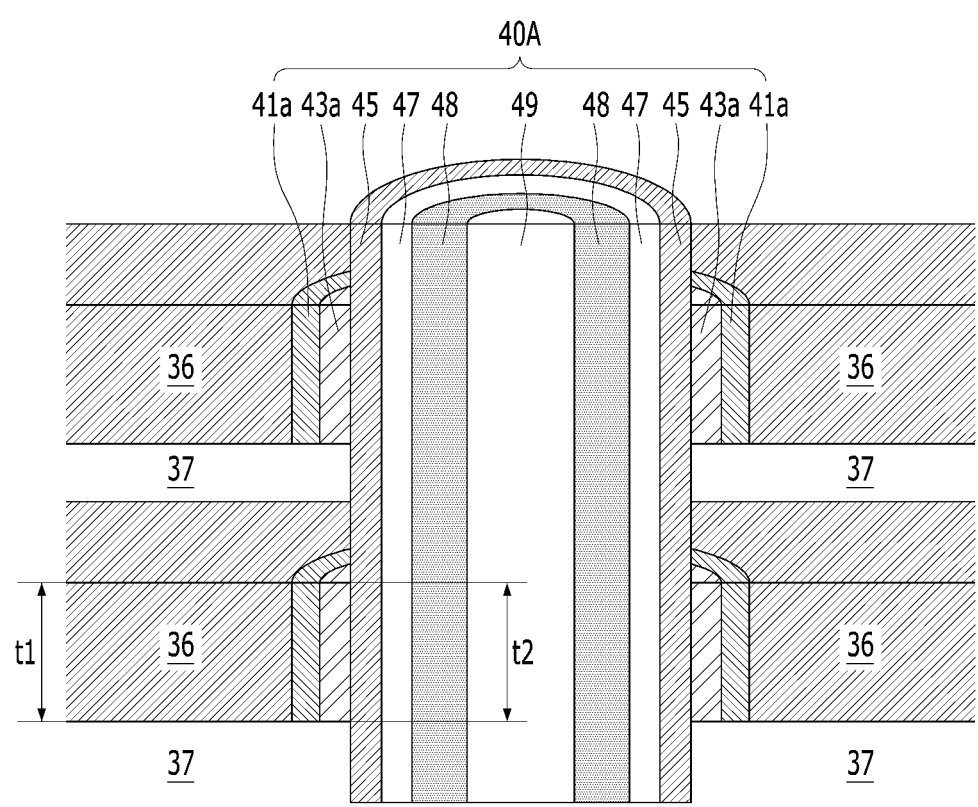
FIGS. 2A to 2F and FIG. 3 are enlarged views of an area A shown in FIG. 1, respectively.

FIGS. 2A to 2F and FIG. 3 are enlarged views of an area A shown in FIG. 1. Referring to FIG. 2A, a channel pillar 40A according to this embodiment of the present disclosure may include a confined blocking dielectric layer 41a, a confined outer charge trap layer 43a, an inner charge trap layer 45, a tunneling dielectric layer 47, a channel layer 48, and a central dielectric layer 49. The confined blocking dielectric layer 41a may have a ring shape surrounding the side surface of the confined outer charge trap layer 43a. The confined outer charge trap layer 43a may have a ring shape surrounding the side surface of the inner charge trap layer 45. The inner charge trap layer 45 may have a cylinder shape surrounding the side surface of the tunneling dielectric layer 47. The tunneling dielectric layer 47 may have a cylinder shape surrounding the side surface of the channel layer 48. The channel layer 48 may have a cylinder shape surrounding the side surface of the central dielectric layer 49. The central dielectric layer 49 may have a pillar shape. Throughout the present disclosure, the cylinder shape may mean extending vertically so as to be horizontally adjacent to a plurality of the stacked word lines and the interlayer dielectric layer, and the ring shape may mean being vertically discretely separated so as to be horizontally adjacent to a word line of one layer among the word lines.

The vertical thicknesses t2 of the confined blocking dielectric layer 41a and the confined outer charge trap layer 43a may be substantially the same as or similar to the vertical thickness t1 of the word line 36. For example, the vertical thickness t1 of the word line 36 may be substantially the same as or greater than the vertical thickness t2 of the confined outer charge trap layer 43a. According to another embodiment of the present disclosure, the vertical thicknesses t2 of the confined blocking dielectric layer 41a and the confined outer charge trap layer 43a may be smaller than the vertical thickness t1 of the word line 36. Therefore, the confined blocking dielectric layer 41a and the confined outer charge trap layer 43a may be confined within the vertical thickness t1 of the word line 36, individually.

The confined blocking dielectric layer 41a may include a high-k dielectric material, such as for example $ZrO_x$, $HfO_x$, HfON, $Al_2O_3$, $Y_2O_3$, $LaO_x$, $SrO_x$, and $TiO_x$ (or a combination thereof).

Each of the confined outer charge trap layer 43a and the inner charge trap layer 45 may include a high-k dielectric material such as for example $ZrO_x$, $HfO_x$, HfON, $Al_2O_3$, $Y_2O_3$, $LaO_x$, $SrO_x$, and $TiO_x$, may include oxide semiconductor materials such as for example IGZO (Indium Gallium Zinc Oxide), ZnO, ZTO (zinc-tin-oxide), $Ga_2O_3$ and $SnO_2$, or may include nitrides such as SiN, SiCN, SiBN, SiON, SiCON, or SiBCN (or may include a combination of these dielectric materials). The confined outer charge trap layer 43a and the outer charge trap layer 45 may contain different dielectric materials.

The tunneling dielectric layer 47 may include silicon oxide ($SiO_2$).

The channel layer 48 may include at least one of intrinsic silicon, polycrystalline silicon, epitaxially formed monocrystalline silicon, and a metal silicide (or a combination thereof).

The central dielectric layer 49 may include a low-k dielectric material such as for example silicon oxide ($SiO_2$).

High-k materials may trap many charges but have a poor charge migration property. The interlayer dielectric layers 37 including a nitride may block the migration of charges between the confined outer charge trap layers 43a. Since the channel pillar 40A of the 3D semiconductor device according to one embodiment of the present disclosure has the outer charge trap layers 43a that are discretely separated from each other in the vertical direction, the migration of charges between the confined outer charge trap layers 43a may be prevented. As seen in FIG. 2A, the interlayer dielectric layers 37 fill a space between the separate and distinct charge trap layers 43a to isolate the separate and distinct ring-shaped charge trap layers 43a from each other in order to retain charge in each of the charge traps. Therefore, the data retention characteristics of the 3D semiconductor device according to this embodiment of the present disclosure may be improved.

Figure 2B:
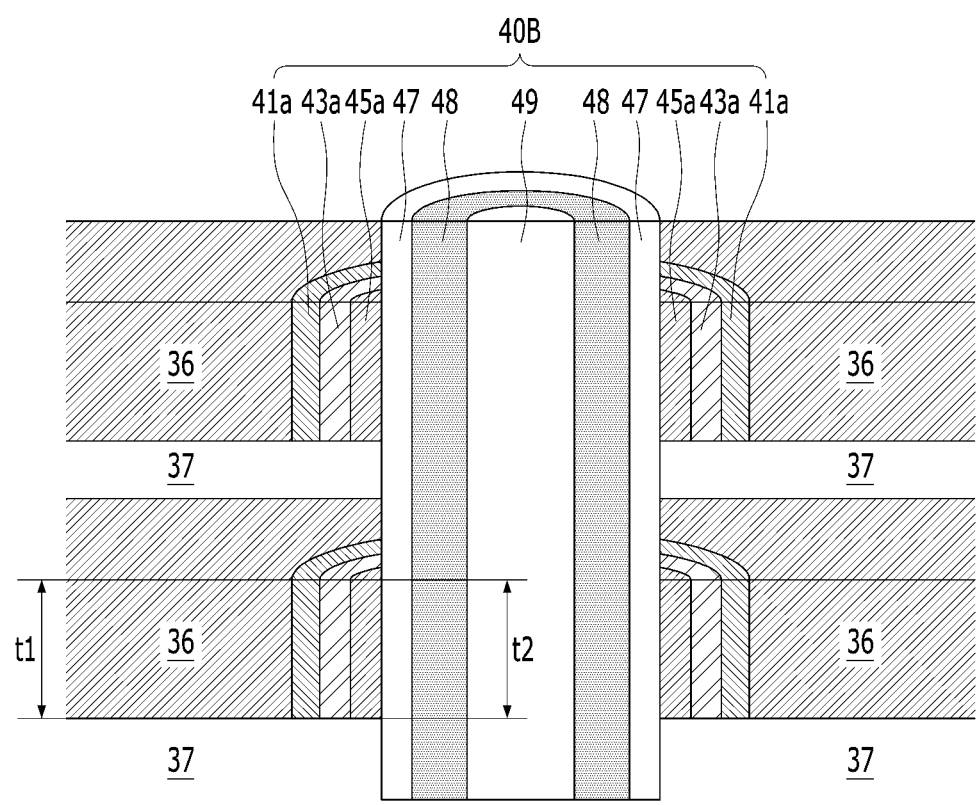

Referring to FIG. 2B, the channel pillar 40B according to this embodiment of the present disclosure may include the confined blocking dielectric layer 41a, the confined outer charge trap layer 43a, the confined inner charge trap layer 45a, the tunneling dielectric layer 47, the channel layer 48, and the central dielectric layer 49. The vertical thicknesses t2 of the confined blocking dielectric layer 41a, the confined outer charge trap layer 43a, and the confined inner charge trap layer 45a may be substantially the same as or similar to the vertical thickness t1 of the word line 36. According to one embodiment of the present disclosure, the vertical thicknesses t2 of the confined blocking dielectric layer 41a, the confined outer charge trap layer 43a, and the confined inner charge trap layer 45a may be smaller than the vertical thickness t1 of the word line 36. Therefore, each of the confined blocking dielectric layer 41a, the confined outer charge trap layer 43a, and the confined inner charge trap layer 45a may be confined within the vertical thickness t1 of the word line 36.

Charge migration may also occur between the inner charge trap layers 45a. The interlayer dielectric layers 37 between the inner charge trap layers 45a may block the charge migration between the inner charge trap layers 45a. Since the channel pillar 40B of the 3D semiconductor device according to one embodiment of the present disclosure includes the outer charge trap layers 43a that are discretely separated from each other in the vertical direction and the inner charge trap layers 45a that are discretely separated from each other in the vertical direction, the migration of charges between the inner charge trap layers 45a may be prevented. Therefore, the data retention characteristics of the 3D semiconductor device according to this embodiment of the present disclosure may be improved. As seen in FIG. 2B, the interlayer dielectric layers 37 may fill spaces between the separate and distinct charge trap layers 43a and 45a to isolate the separate and distinct ring-shaped charge trap layers 43a and 45a from each other in order to retain charge in each of the charge traps.

Figure 2C:
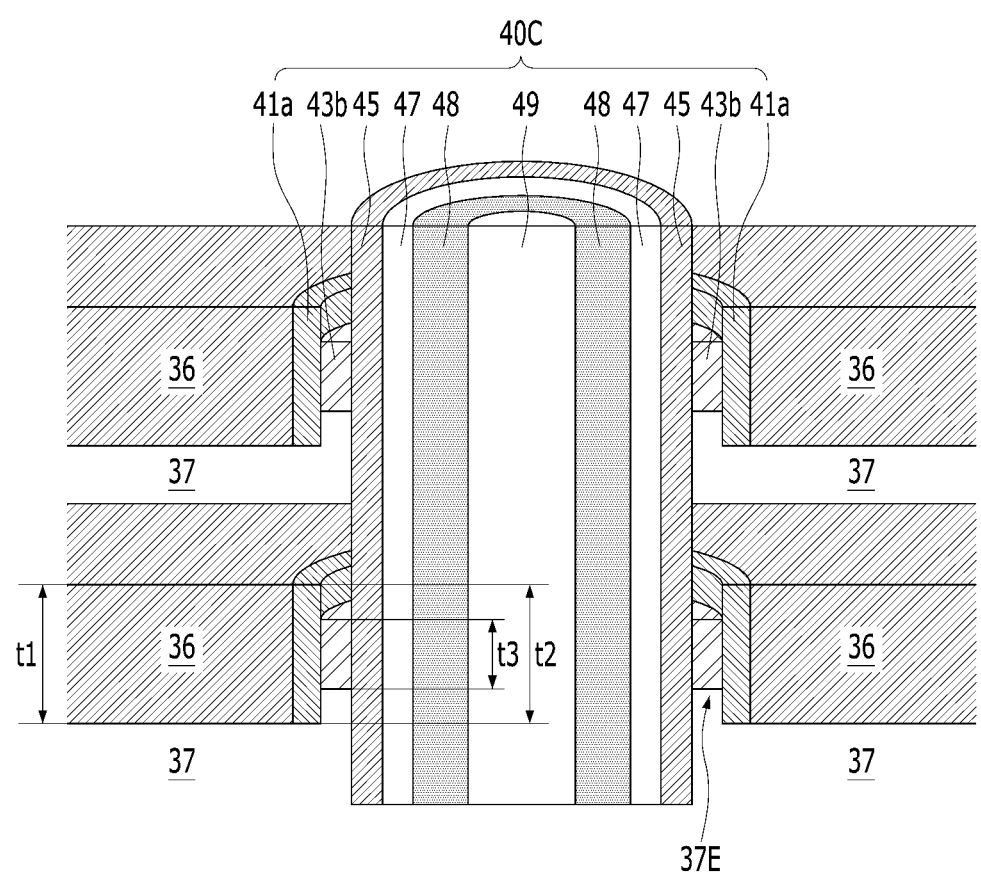

Referring to FIG. 2C, the channel pillar 40C according to one embodiment of the present disclosure may include the confined blocking dielectric layer 41a, a more confined outer charge trap layer 43b, the inner charge trap layer 45, the tunneling dielectric layer 47, the channel layer 48, and the central dielectric layer 49. The vertical thickness t3 of the more confined outer charge trap layer 43b in this embodiment is smaller than the vertical thickness t1 of the word line 36 and the vertical thickness t2 of the confined blocking dielectric layer 41a. The interlayer dielectric layer 37 may protrude on the upper and lower surfaces of the more confined outer charge trap layer 43b. In other words, an edge portion 37E of the interlayer dielectric layer 37 may be interposed between the confined blocking dielectric layer 41a and the inner charge trap layer 45.

Since the spacing between the more confined outer charge trap layers 43b becomes larger, charge migration within the outer charge trap layers 43b may be further prevented. Furthermore, as seen in FIG. 2C, the interlayer dielectric layers 37 and the edge portion 37E may fill spaces between the separate and distinct charge trap layers 43a and, 45a to isolate the separate and distinct ring-shaped charge trap layers 43a and 45a from each other in order to retain charge in each of the charge traps.

The edge portion 37E may include a dielectric material having a higher dielectric constant than silicon oxide ($SiO_2$), such as for example SiN, SiBN, SiCN, SiON, SiCON, or SiBCN (or a combination thereof).

Figure 2D:
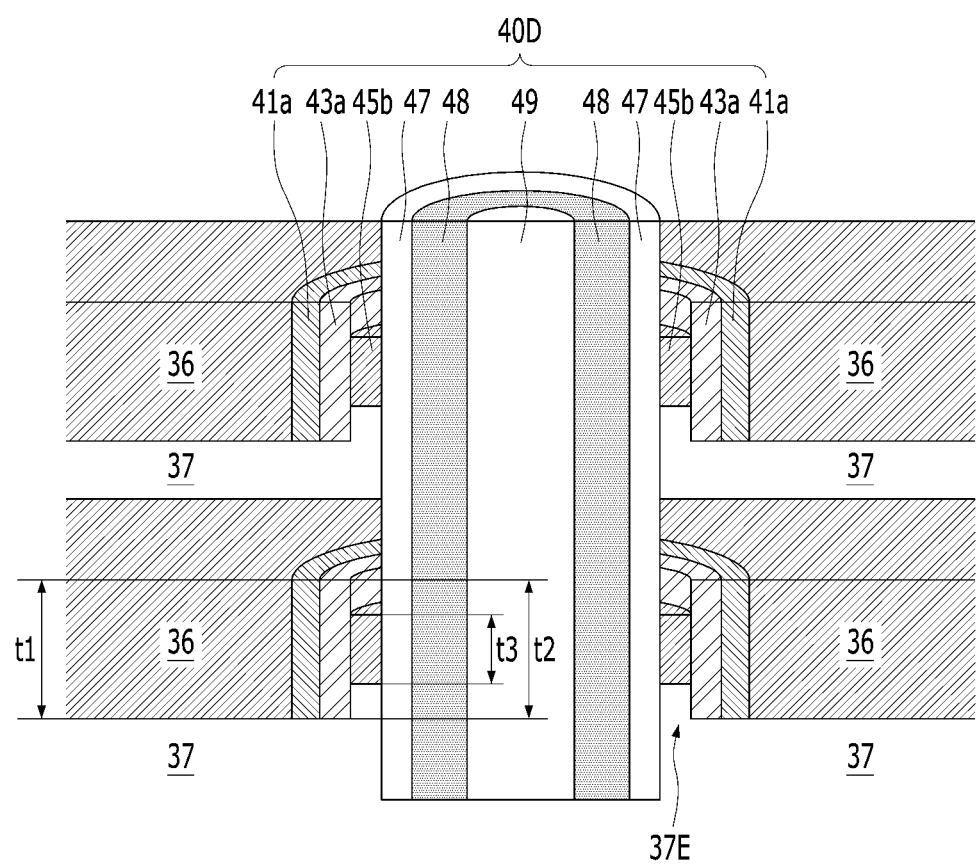

Referring to FIG. 2D, the channel pillar 40D according to this embodiment of the present disclosure may include the confined blocking dielectric layer 41a, the confined outer charge trap layer 43a, the more confined inner charge trap layer 45b, the tunneling dielectric layer 47, the channel layer 48, and the central dielectric layer 49. The vertical thickness t3 of the more confined inner charge trap layer 45b may be smaller than the vertical thickness t1 of the word line 36, and may be smaller than the vertical thicknesses t2 of the confined blocking dielectric layer 41a and the confined outer charge trap layer 43a. An interlayer dielectric layer 37 may extend above and below the more confined inner charge trap layer 45b. In other words, the edge portion 37E of the interlayer dielectric layer 37 may be interposed between the confined outer charge trap layer 43a and the channel layer 47.

Since the channel pillars 40C and 40D of the 3D semiconductor device according to the embodiments discussed above of the present disclosure may include the edge portion 37E, the spacing between the more confined inner charge trap layers 45b becomes larger. Therefore, charge migration in the inner charge trap layers 45b may be further prevented. Accordingly, the data retention characteristics of the 3D semiconductor device according to the embodiment of the present disclosure may be improved further.

Figure 2E:
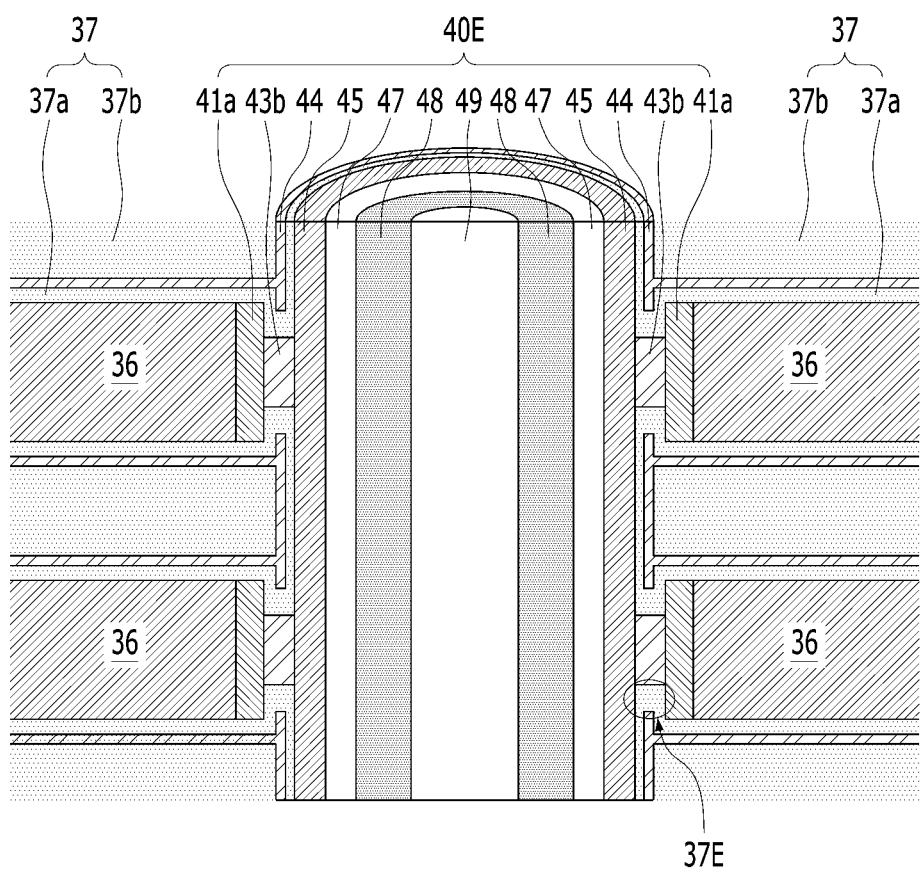

Referring to FIG. 2E, the channel pillar 40E according to this embodiment of the present disclosure may further include an edge charge trap layer 44, as compared to the channel pillar 40C described earlier with reference to FIG. 2C. The interlayer dielectric layer 37 may include the outer interlayer dielectric layer 37a and the inner interlayer dielectric layer 37b. The outer interlayer dielectric layer 37a may be conformally formed in the form of a liner on the surfaces of the word line 36, the confined blocking dielectric layer 41a, the more confined outer charge trap layer 43b, and the inner charge trap layer 45. The inner interlayer dielectric layer 37b may be formed on the surface of the word lines 36 to fill the space between the word lines 36. For example, it may be formed between the edge charge trap layers 44 on the surfaces of the word lines 36. The edge charge trap layer 44 may be interposed in the edge portion 37E between the blocking dielectric layer 41a and the inner charge trap layer 45 so as to be adjacent to the upper and lower surfaces of the more confined outer charge trap layer 43b. The edge charge trap layer 44 may have a ring shape surrounding the sidewall of the channel pillar 40E. The edge charge trap layer 44 may be conformally formed over the outer interlayer dielectric layer 37a. The outer interlayer dielectric layer 37a may be interposed between the edge charge trap layer 44 and the channel pillar 40E and between the edge charge trap layer 44 and the word lines 36. The edge charge trap layer 44 may trap charges as an additional charge trap layer. The edge charge trap layer 44 may include a dielectric material having a higher dielectric constant than silicon oxide (SiO$_2$), such as for example SiN, SiBN, SiCN, SiON, SiCON, or SiBCN (or a combination thereof). The edge portion 37E and the edge charge trap layer 44 may include different materials.

Figure 2F:
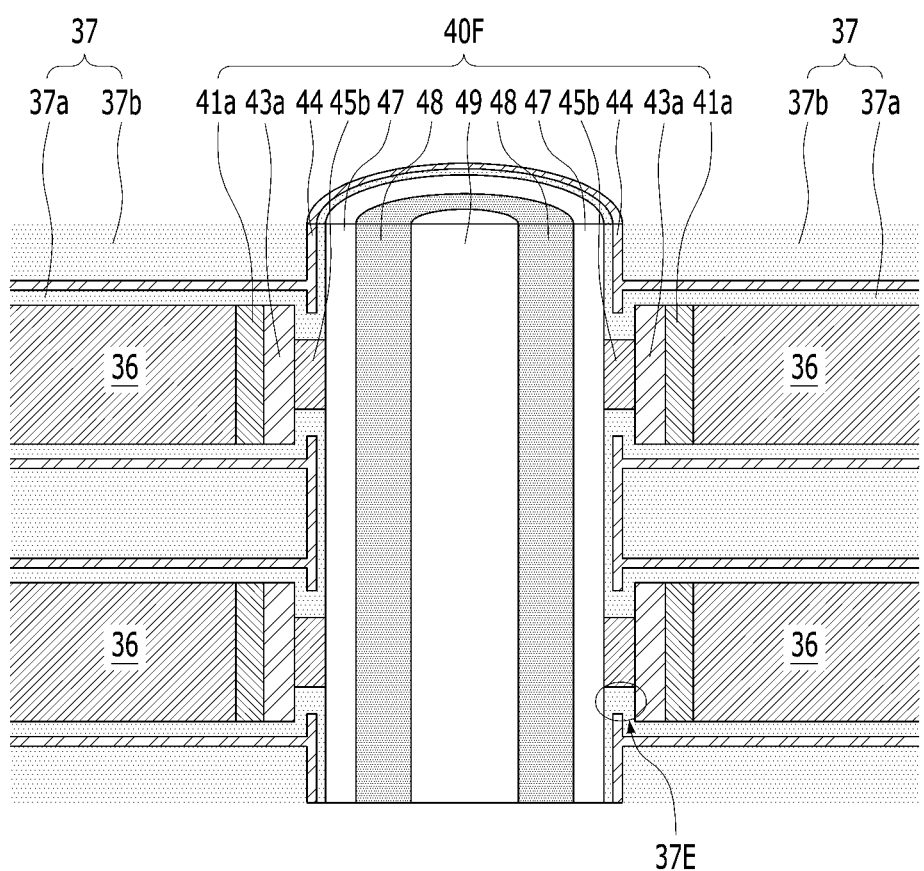

Referring to FIG. 2F, the channel pillar 40F according to this embodiment of the present disclosure may further include the edge charge trap layer 44, as compared to the channel pillar 40D described earlier with reference to FIG. 2D. The interlayer dielectric layer 37 may include the outer interlayer dielectric layer 37a and the inner interlayer dielectric layer 37b. The outer interlayer dielectric layer 37a may be conformally formed in the form of a liner on the surfaces of the word line 36, the confined blocking dielectric layer 41a, the confined outer charge trap layer 43b, the more confined inner charge trap layer 45b, and the channel layer 47. The edge charge trap layer 44 may be interposed in the edge portion 37E between the confined outer charge trap layer 43a and the channel layer 47 to be adjacent to the upper and lower surfaces of the more confined inner charge trap layer 45b. The edge charge trap layer 44 may trap charges as an additional charge trap layer.

Since the channel pillars 40E and 40F of the 3D semiconductor device according to one embodiment of the present disclosure further include an edge charge trap layer 44, the charge trap ability may be improved.

Figure 3:
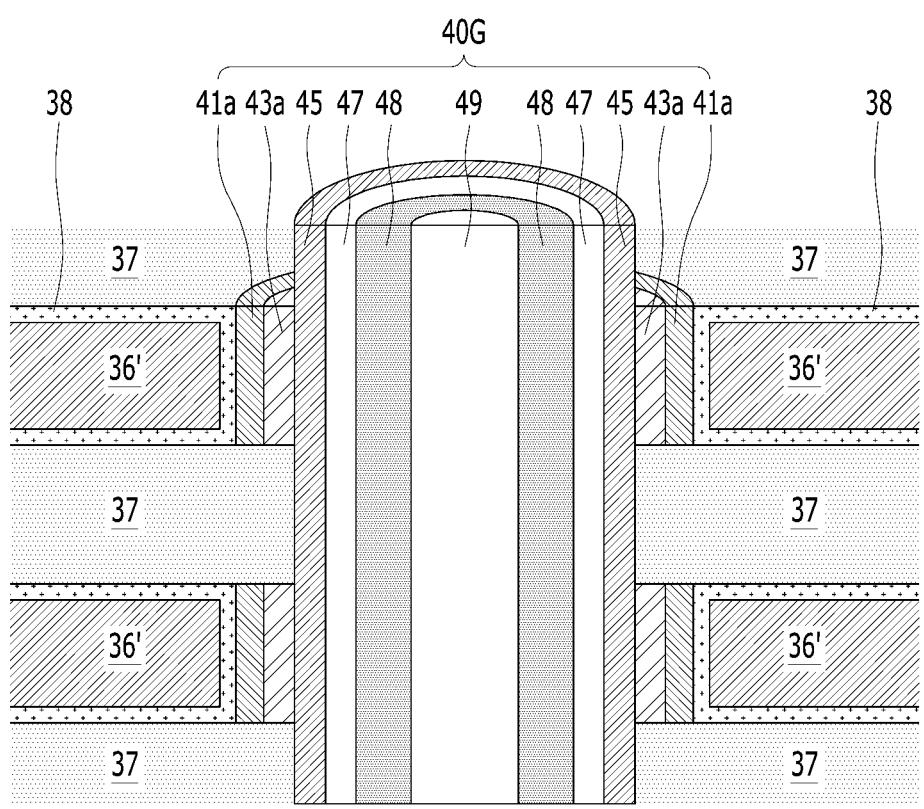

Referring to FIG. 3, a channel pillar 40G according to this embodiment of the present disclosure may include a barrier layer 38 and a metal word line 36' instead of the word line 36, as compared to the channel pillar 40A described with reference to FIG. 2A. The barrier layer 38 may be conformally formed on the surfaces of the interlayer dielectric layer 37 and the confined blocking dielectric layer 41a. The barrier layer 38 may include a barrier metal compound, such as for example TiN, Ti/TiN, TaN, or Ta/TaN (or a combination thereof). The metal word line 36' may include a metal, such as for example tungsten (W). The word line 36 of the channel pillars 40A to 40F described with reference to FIGS. 2B to 2F may be compatible with the barrier layer 38 and the metal word line 36' of the channel pillar 40G described with reference to FIG. 3.

Figure 4:
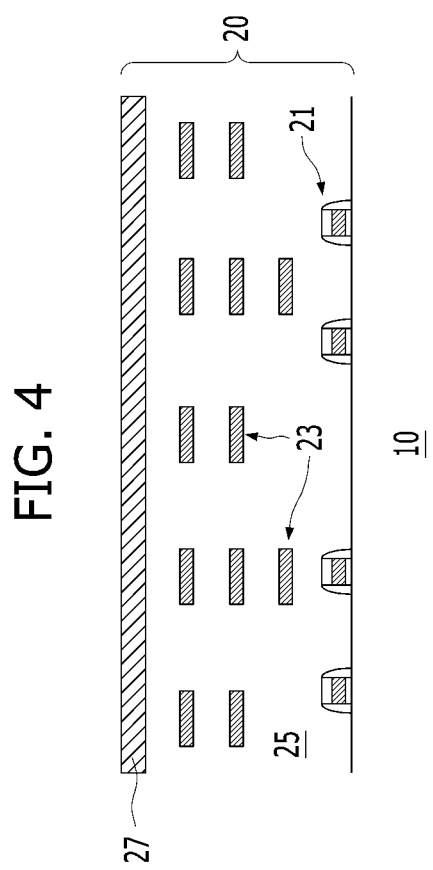
FIGS. 4 to 20 are longitudinal cross-sectional views and partially enlarged views illustrating methods of fabricating a three-dimensional (3D) semiconductor device in accordance with diverse embodiments of the present disclosure.

FIGS. 4 to 11 are longitudinal cross-sectional views and partially enlarged views illustrating a method of fabricating a 3D semiconductor device according to various embodiments of the present disclosure. Referring to FIG. 4, a method of fabricating a 3D semiconductor device in accordance with one embodiment of the present disclosure may include forming a logic circuit layer 20 over the substrate 10. The forming of the logic circuit layer 20 may include forming transistors 21, logic lines 23, a logic dielectric layer 25, and a common electrode layer 27 over the substrate 10. The forming of the common electrode layer 27 may include forming at least one of an N-doped silicon layer, a metal layer such as tungsten (W), a metal compound layer such as titanium nitride (TiN), or a metal silicide (or a combination thereof) over the logic dielectric layer 25.

Figure 5:
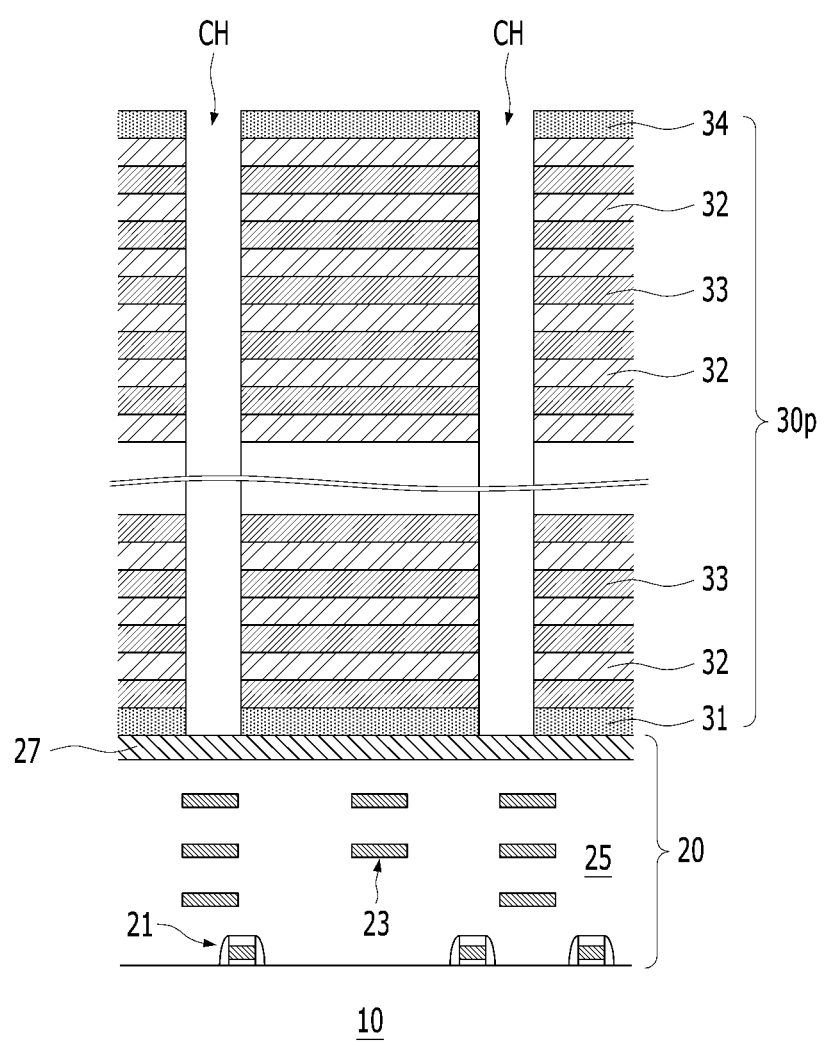

Referring to FIG. 5, the method may further include forming a preliminary word line stack 30p over the logic circuit layer 20, and forming a channel hole CH that exposes the common electrode layer 27 by vertically penetrating the preliminary word line stack 30p. The forming of the preliminary word line stack 30p may include stacking the bottom dielectric layer 31, sacrificial dielectric layers 32, the preliminary word line layers 33, and the top dielectric layer 34 over the logic circuit layer 20 by performing a plurality of deposition processes. The sacrificial dielectric layers 32 and the preliminary word line layers 33 may be alternately stacked between the bottom dielectric layer 31 and the top dielectric layer 34. The bottom dielectric layer 31 and the top dielectric layer 34 may include silicon oxide. The sacrificial dielectric layers 32 may have an etch selectivity with respect to the bottom dielectric layer 31, the preliminary word line layers 33, and the top dielectric layer 34. For example, the sacrificial dielectric layers 32 may include silicon nitride. The preliminary word line layers 33 may have an etch selectivity with respect to the bottom dielectric layer 31 and the top dielectric layer 34. The preliminary word line layers 33 may have a conductive material. For example, the preliminary word line layers 33 may include polycrystalline silicon. The forming of the channel hole CH may include forming a mask pattern over the preliminary word line stack 30p and performing a selective etch process by using the mask pattern as an etch mask. Subsequently, the mask pattern may be removed. The common electrode layer 27 may be exposed at the bottom of the channel hole CH.

Figure 6A:
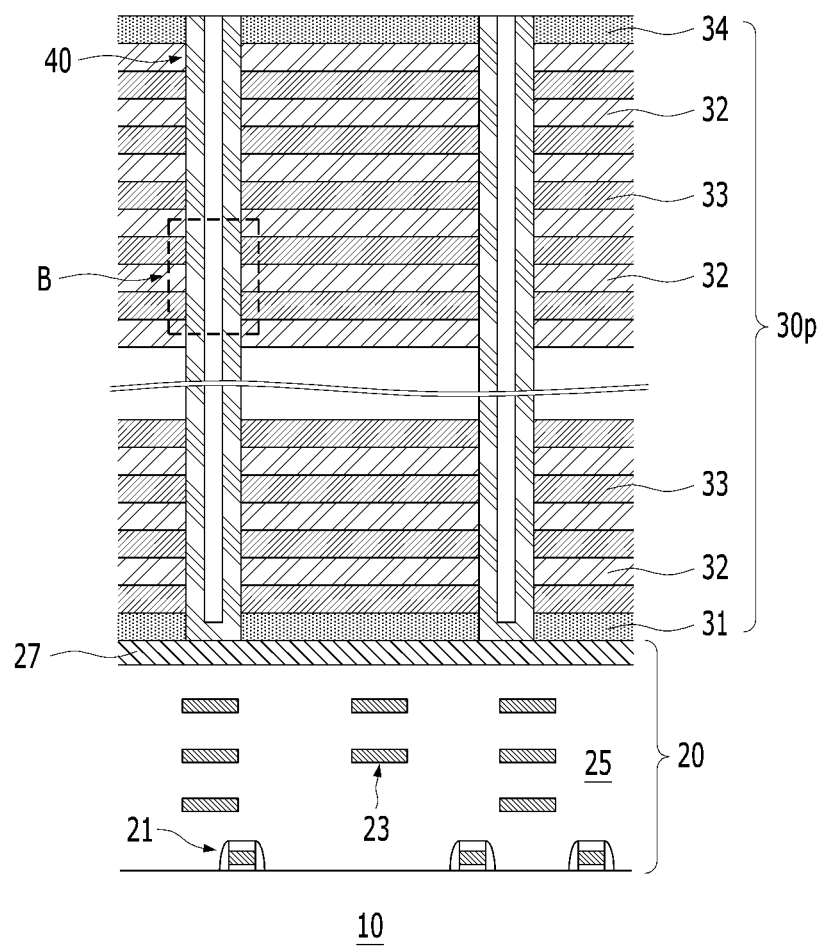
Figure 6B:
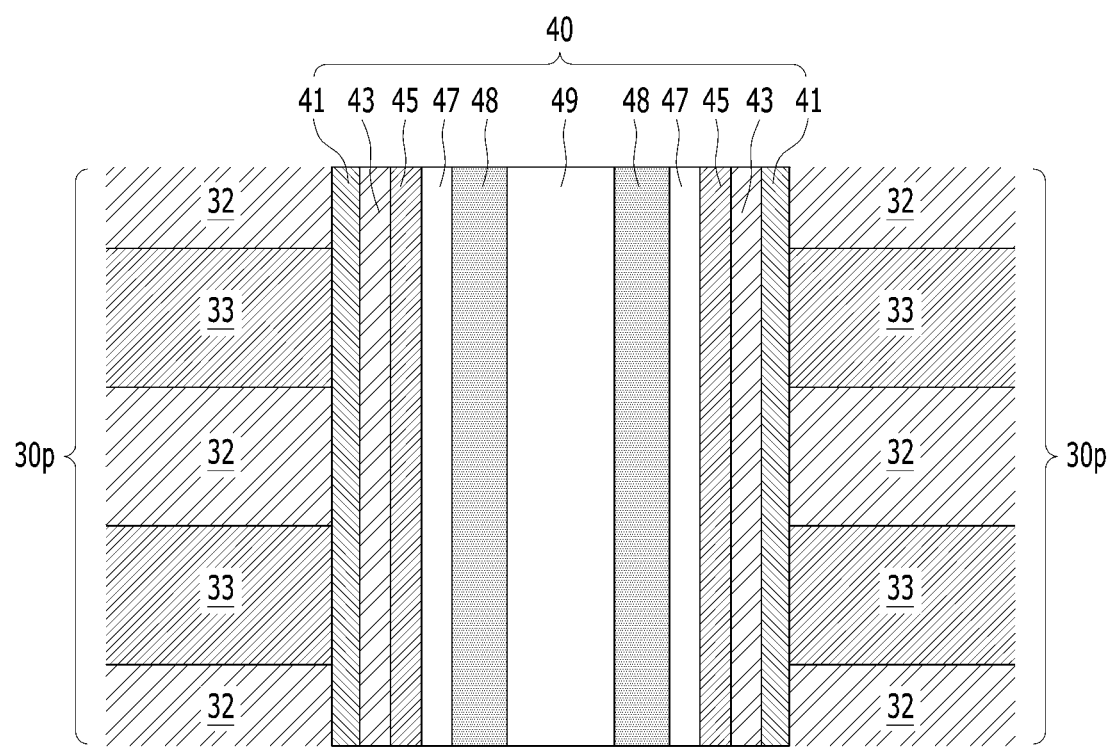

FIG. 6B is an enlarged view of an area B shown in FIG. 6A. Referring to FIGS. 6A and 6B, the method may further include forming a channel pillar 40 in the channel hole CH. The forming of the channel pillar 40 may include conformally forming the blocking dielectric layer 41, the outer charge trap layer 43, the inner charge trap layer 45, the tunneling dielectric layer 47, and the channel layer 48 on the inner wall of the channel hole CH by performing a plurality of deposition processes and an etching process, and filling the channel hole CH with the central dielectric layer 49 filling over the channel layer 48. The blocking dielectric layer 41, the outer charge trap layer 43, the inner charge trap layer 45, the tunneling dielectric layer 47, and the channel layer 48 may have a cylinder shape. The blocking dielectric layer 41 may surround the side surface of the outer charge trap layer 43, and the outer charge trap layer 43 may surround the side surface of the inner charge trap layer 45. The inner charge trap layer 45 may surround the side surface of the tunneling dielectric layer 47, and the tunneling dielectric layer 47 may surround the side surface of the channel layer 48. The channel layer 48 may surround the side surface of the central dielectric layer 49. The central dielectric layer 49 may have a pillar shape.

The blocking dielectric layer 41 may include a dielectric material having a high work function, such as for example aluminum oxide (Al$_2$O$_3$). According to one embodiment of the present invention, the blocking dielectric layer 41 may be a double layer including a silicon oxide (SiO$_2$) layer and an aluminum oxide (Al$_2$O$_3$) layer. Each of the outer charge trap layer 43 and the inner charge trap layer 45 may include an oxide semiconductor such as for example IGZO (indium gallium zinc oxide), may include a high-k oxide, and may include silicon nitride (or may include a combination of these dielectric materials). The high-k oxide may include hafnium oxide (HfO$_x$), zirconium oxide (ZrO$_x$), or other metal oxides. The outer charge trap layer 43 and the inner charge trap layer 45 may include different materials. For example, when the outer charge trap layer 43 includes an oxide semiconductor, the inner charge trap layer 45 may include a high-k oxide or silicon nitride. When the outer charge trap layer 43 includes a high-k oxide, the inner charge trap layer 45 may include an oxide semiconductor or silicon nitride. When the outer charge trap layer 43 may include silicon nitride, the inner charge trap layer 45 may include an oxide semiconductor or a high-k oxide. The tunneling dielectric layer 47 may include silicon oxide such as SiO$_2$. The channel layer 48 may include a semiconductor material such as for example polycrystalline silicon. The central dielectric layer 49 may include silicon oxide such as for example $SiO_2$.

Figure 7:
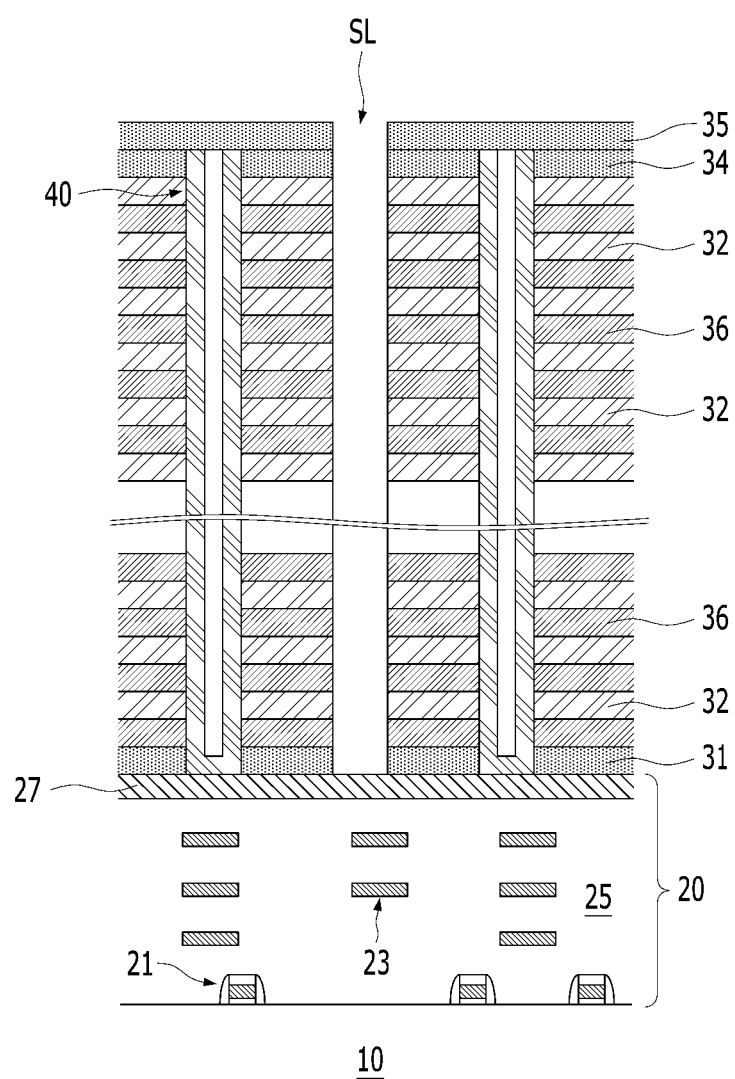

Referring to FIG. 7, the method may further include forming the buffer dielectric layer 35 over the top dielectric layer 34, forming a mask pattern over the buffer dielectric layer 35, and forming a slit SL by performing a selective etching process. The slit SL may expose the common electrode layer 27. Subsequently, the mask pattern may be removed. According to one embodiment of the present invention, the buffer dielectric layer 35 may be used as a hard mask. The buffer dielectric layer 35 may include silicon oxide. The slit SL may physically separate the preliminary word line layer 33 in the horizontal direction to form the word line 36.

Figure 8A:
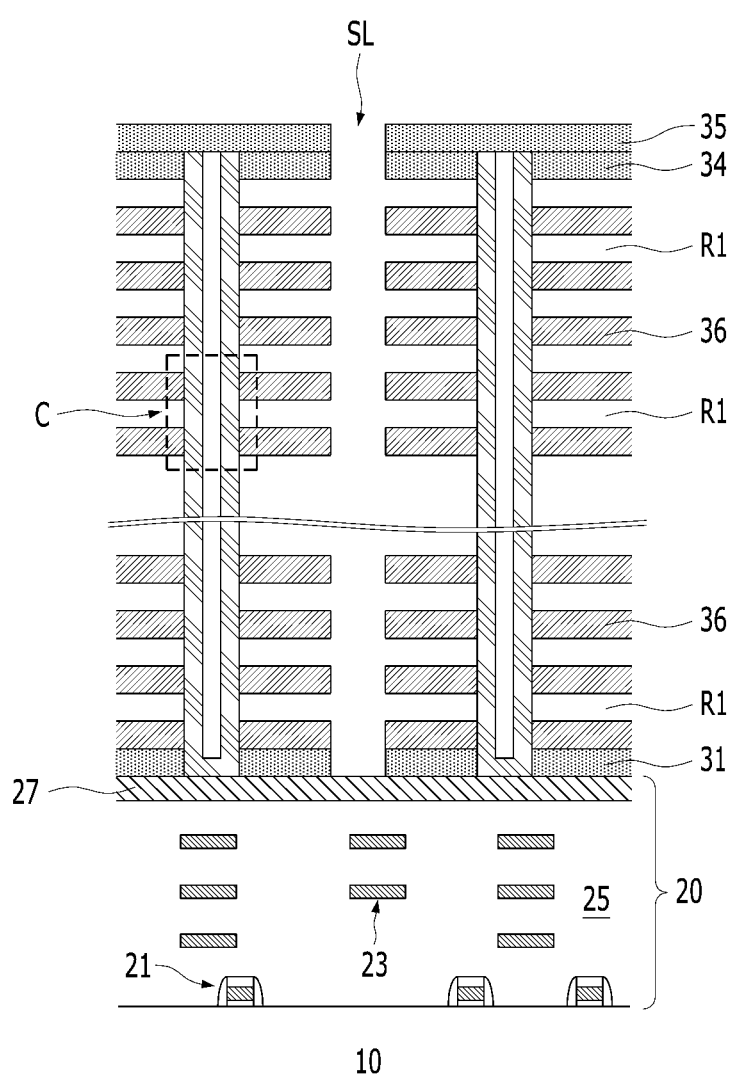
Figure 8B:
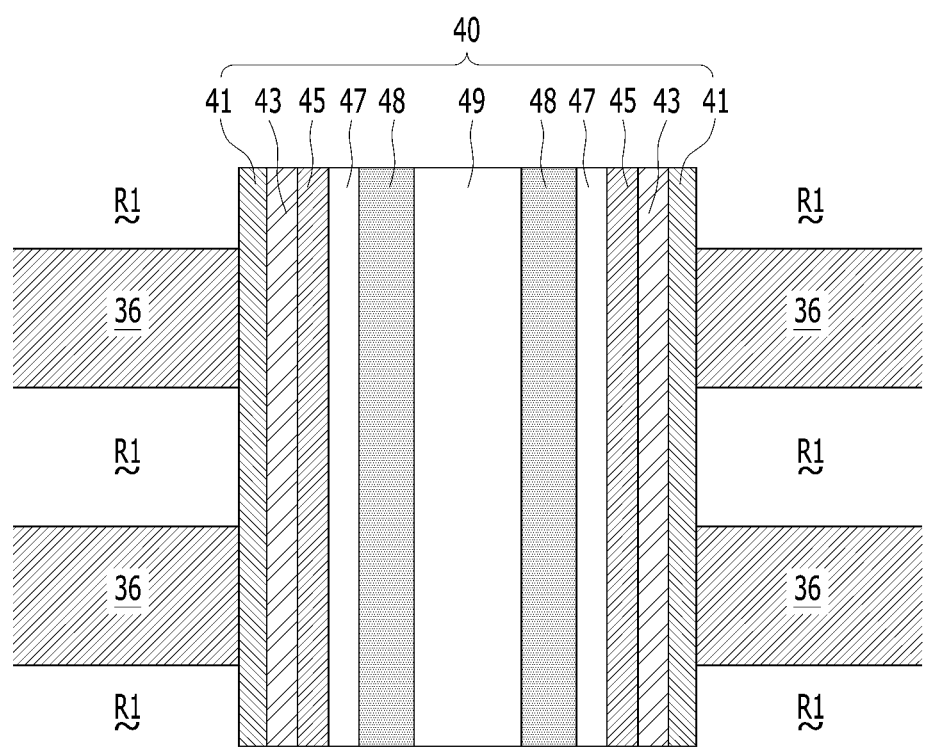

FIG. 8B is an enlarged view of an area C shown in FIG. 8A. Referring to FIGS. 8A and 8B, the method may further include removing the sacrificial dielectric layers 32 through the slit SL by performing a first recessing process. The sacrificial dielectric layers 32 may be removed to form a first recess R1. The first recess R1 may expose the blocking dielectric layer 41.

Figure 9:
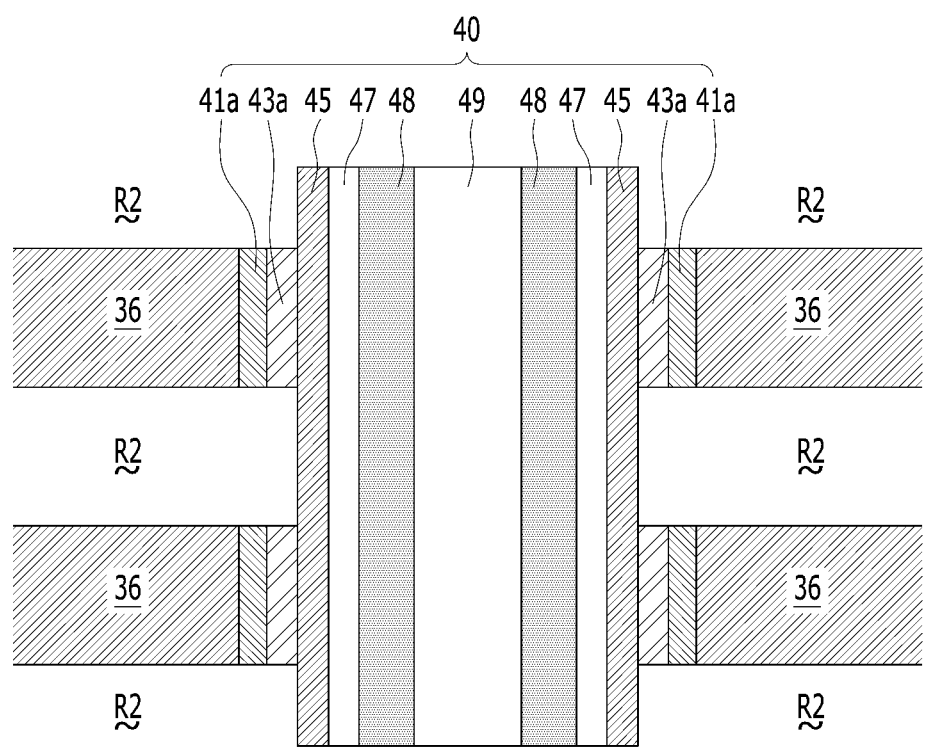

Referring to FIG. 9, the method may further include forming the confined blocking dielectric layer 41a and the confined outer charge trap layer 43a by partially removing the blocking dielectric layer 41 and the outer charge trap layer 43 in the first recess R1 by performing a second recessing process. The first recess R1 may extend in the horizontal direction to extend into the second recess R2. For example, the upper and lower surfaces of the blocking dielectric layer 41, the outer charge trap layer 43, and the word line 36 may be substantially coplanar, respectively. In other words, the confined blocking dielectric layer 41a and the confined outer charge trap layer 43a may be confined within the vertical thickness of the word line 36 in the horizontal direction. The confined blocking dielectric layer 41a and the confined outer charge trap layer 43a may have substantially similar vertical thicknesses.

Figure 10A:
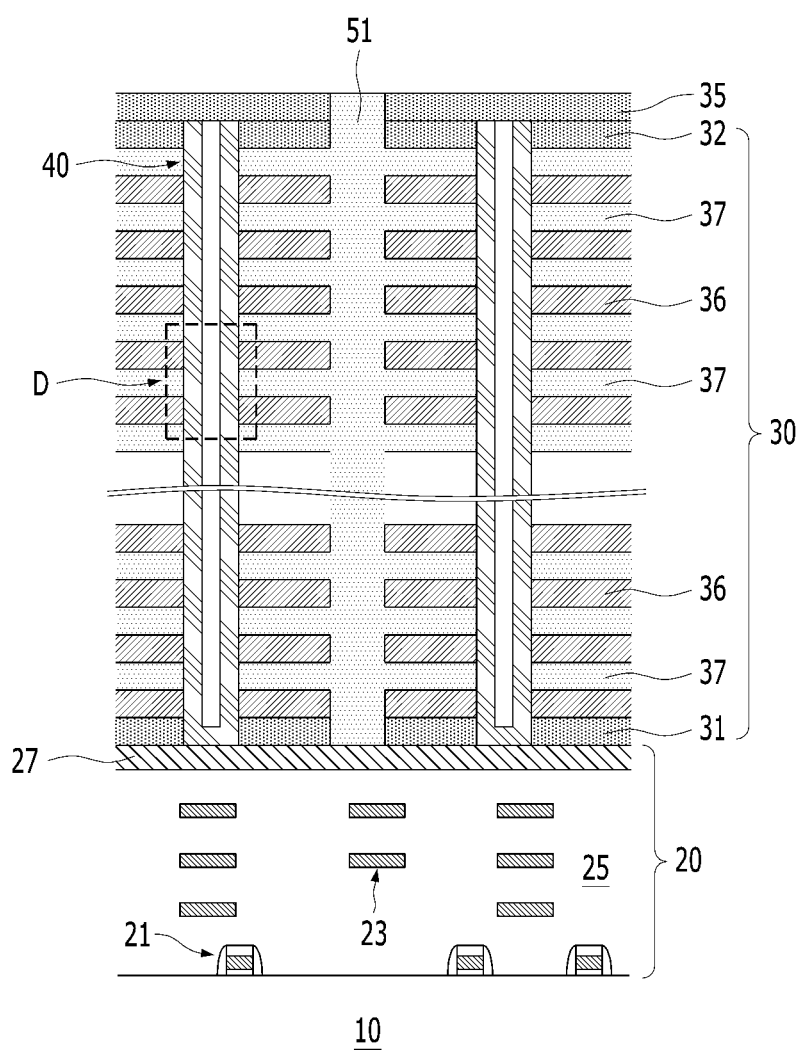
Figure 10B:
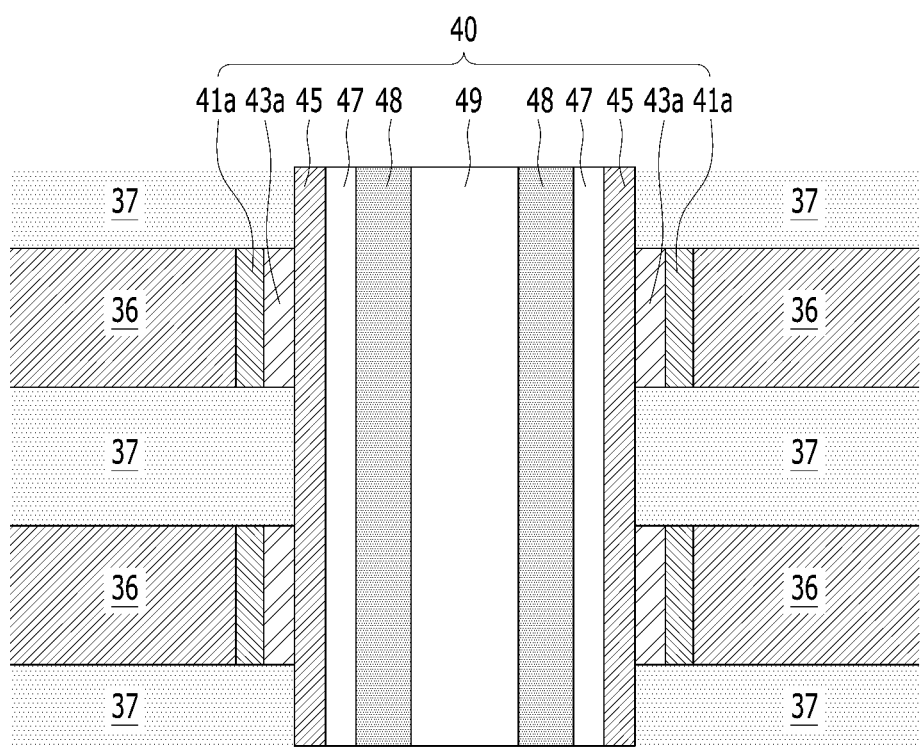

FIG. 10B is an enlarged view of an area D shown in FIG. 10A. Referring to FIGS. 10A and 10B, the method may further include forming the interlayer dielectric layer 37 and the slit dielectric layer 51 by forming a dielectric material in the second recess R2 and the slit SL. The word lines 36 and the interlayer dielectric layers 37 may be alternately positioned between the bottom dielectric layer 31 and the top dielectric layer 32 in the vertical direction. The word lines 36 on the left and the word lines 36 on the right that are positioned at the same horizontal level may be electrically insulated by the slit dielectric layer 51. The confined blocking dielectric layer 41a and the confined outer charge trap layer 43a may be aligned to be substantially horizontal with respect to the word line 36.

Figure 11:
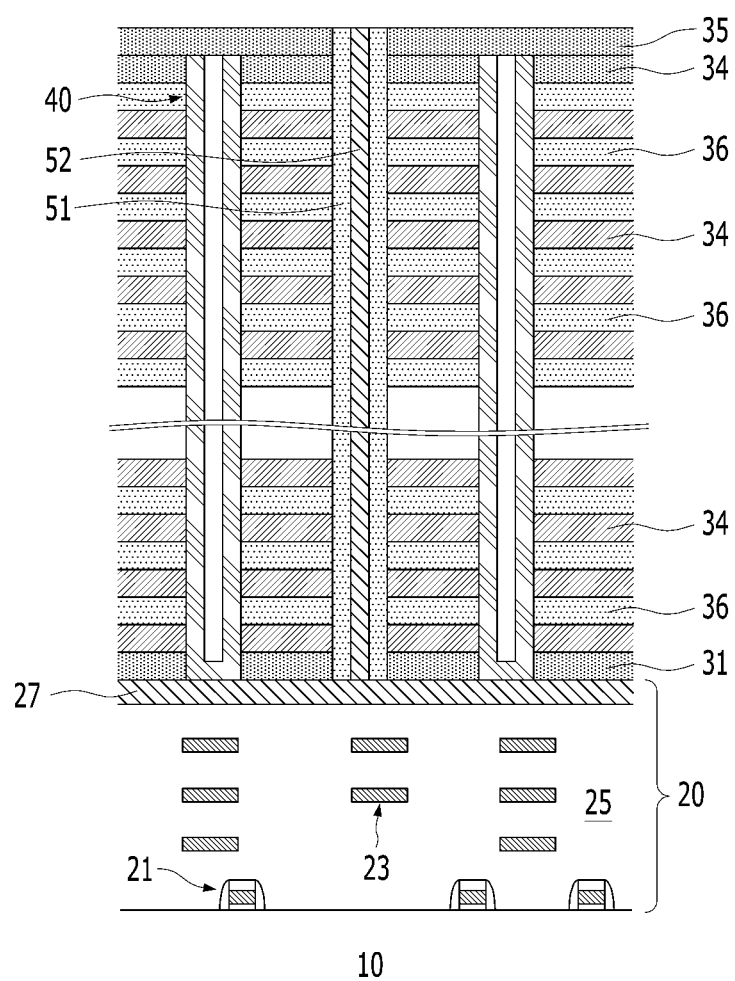

Referring to FIG. 11, the method may further include forming a slit via plug 52 which is electrically connected to the common electrode layer 27 by vertically penetrating the slit dielectric layer 51. The slit via plug 52 may include a conductor, such as for example a metal, a metal compound, or a metal silicide (or a combination thereof).

Subsequently, referring to FIG. 1, the method may further include forming the line dielectric layer 61, and forming the channel contact plug 62 electrically connected to the channel pillar 40 through the line dielectric layer 61 and forming the slit contact plug 63 electrically connected to the slit via plug 52. The forming of the line dielectric layer 61 may include forming a dielectric material such as silicon oxide over the buffer dielectric layer 35 by performing a deposition process. The forming of the channel contact plug 62 and the slit contact plug 63 may include forming holes vertically penetrating the line dielectric layer 61 by performing a photolithography process, a selective etching process, and a deposition process or a plating process, and filling the holes with a conductor. A 3D semiconductor device having the confined blocking dielectric layer 41a and the confined outer charge trap layer 43a illustrated in FIG. 2A may be fabricated.

Figure 12:
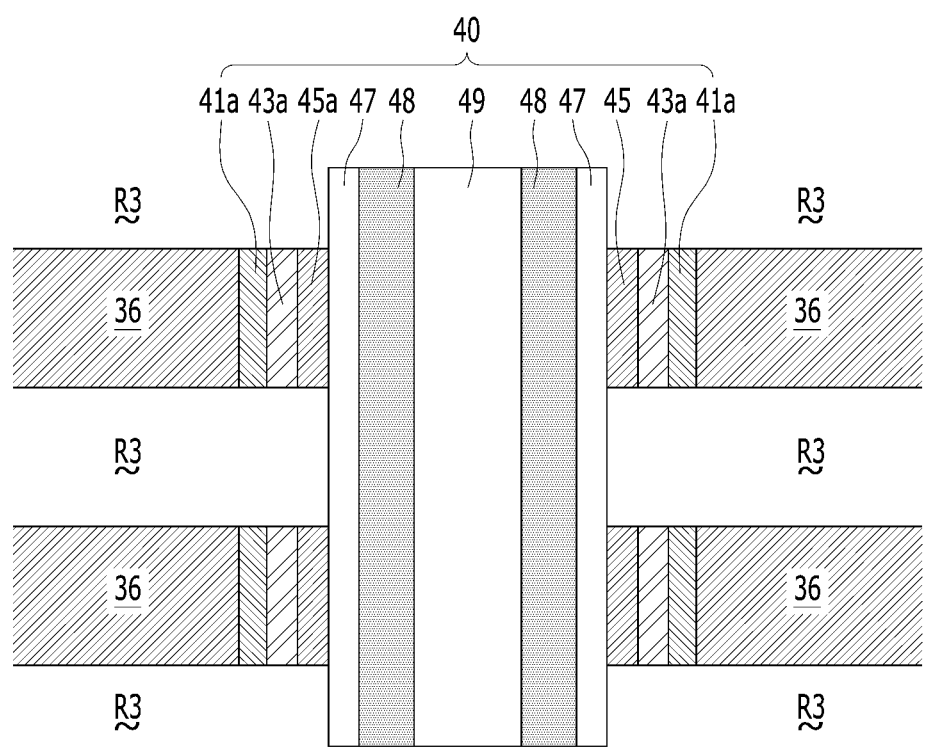

FIG. 12 illustrates a method of fabricating a 3D semiconductor device in accordance with another embodiment of the present disclosure. Referring to FIG. 12, the method of fabricating a 3D semiconductor device in accordance with this embodiment of the present disclosure may further include forming the confined inner charge trap layer 45a by further performing a third recessing process and thereby partially removing the charge trap layer 45 in addition to performing the processes described earlier with reference to FIGS. 4 to 9. A third recess R3 exposing the channel layer 47 may be formed. The confined inner charge trap layer 45a may also be confined within the vertical thickness of the word line 36 in the horizontal direction.

Subsequently, a 3D semiconductor device including the confined blocking dielectric layer 41a, the confined outer charge trap layer 43a, and the confined inner charge trap layer 45a shown in FIG. 2B may be fabricated by performing the processes described above with reference to FIGS. 10A, 10B, 11, and 1.

Figure 13:
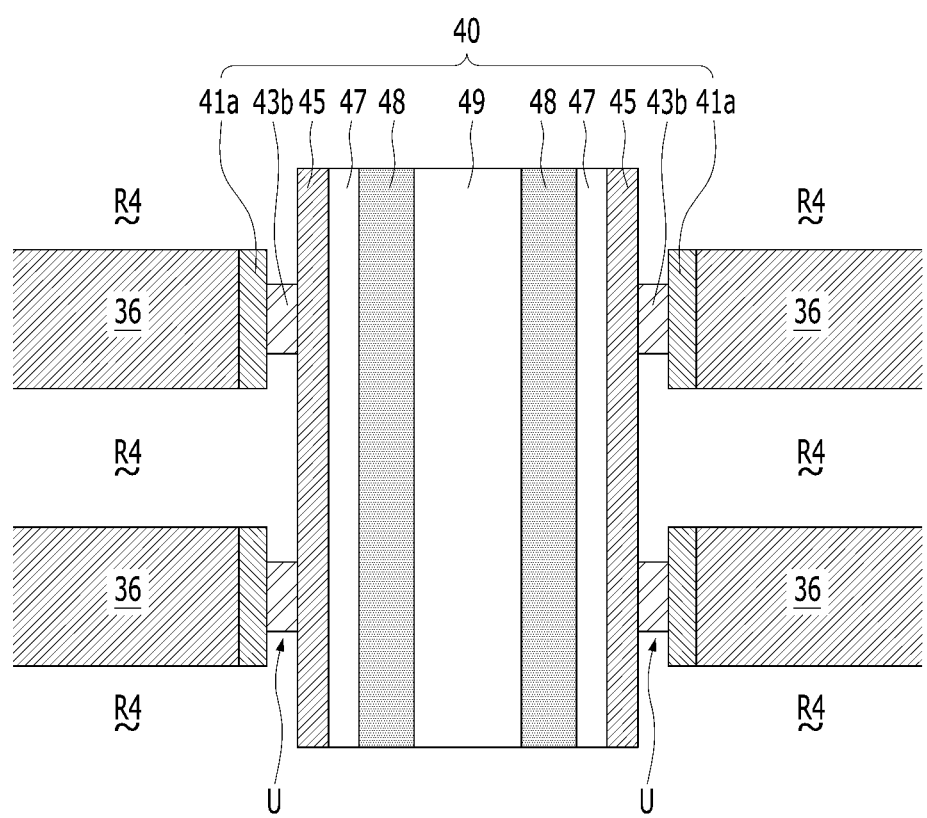

FIG. 13 illustrates a method of fabricating a 3D semiconductor device in accordance with still another embodiment of the present disclosure. Referring to FIG. 13, the method of fabricating a 3D semiconductor device in accordance with this embodiment of the present disclosure may further include forming the more confined outer charge trap layer 43b by performing an additional recessing process in addition to performing the processes described earlier with reference to FIGS. 4 to 9. An undercut region U may be formed between the confined blocking dielectric layer 41a and the inner charge trap layer 45 so as to form a fourth recess R4. The more confined outer charge trap layer 43b may have a smaller vertical thickness than the confined blocking dielectric layer 41a.

Subsequently, a 3D semiconductor device including the confined blocking dielectric layer 41a and the more confined outer charge trap layer 43b shown in FIG. 2C may be fabricated by performing the processes described earlier with reference to FIGS. 10A, 10B, 11, and FIG. 1.

Figure 14:
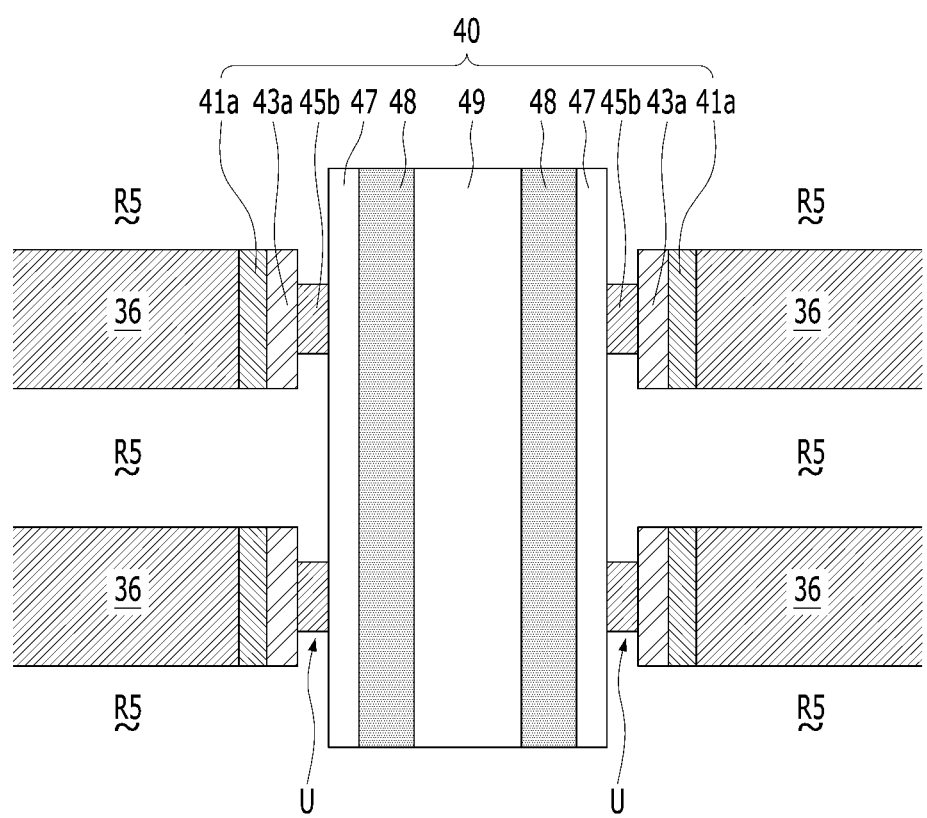

FIG. 14 illustrates a method of fabricating a 3D semiconductor device in accordance with yet another embodiment of the present disclosure. Referring to FIG. 14, the method of fabricating a 3D semiconductor device in accordance with this embodiment of the present disclosure may further include forming the more confined inner charge trap layer 45b by performing an additional recessing process in addition to performing the processes described earlier with reference to FIGS. 4 to 9 and 12. An undercut region U may be formed between the confined inner charge trap layer 43a and the tunneling dielectric layer 47, and as a result, the more confined inner charge trap layer 45b may be formed. The more confined inner charge trap layer 45b may have a smaller vertical thickness than the confined blocking dielectric layer 41a or the confined outer charge trap layer 43a. Subsequently, the method may further include forming a 3D semiconductor device including the confined blocking dielectric layer 41a, the confined outer charge trap layer 43a, and the more confined inner charge trap layer 45b shown in FIG. 2D by performing the processes described with reference to FIGS. 10A, 10B, 11, and 1.

Figure 15:
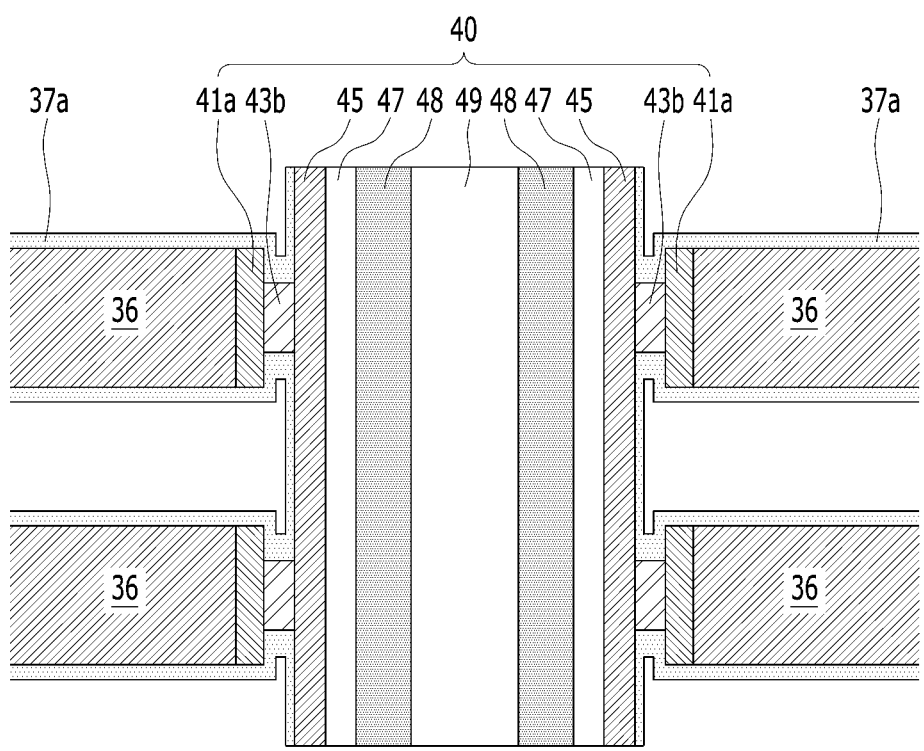
Figure 16:
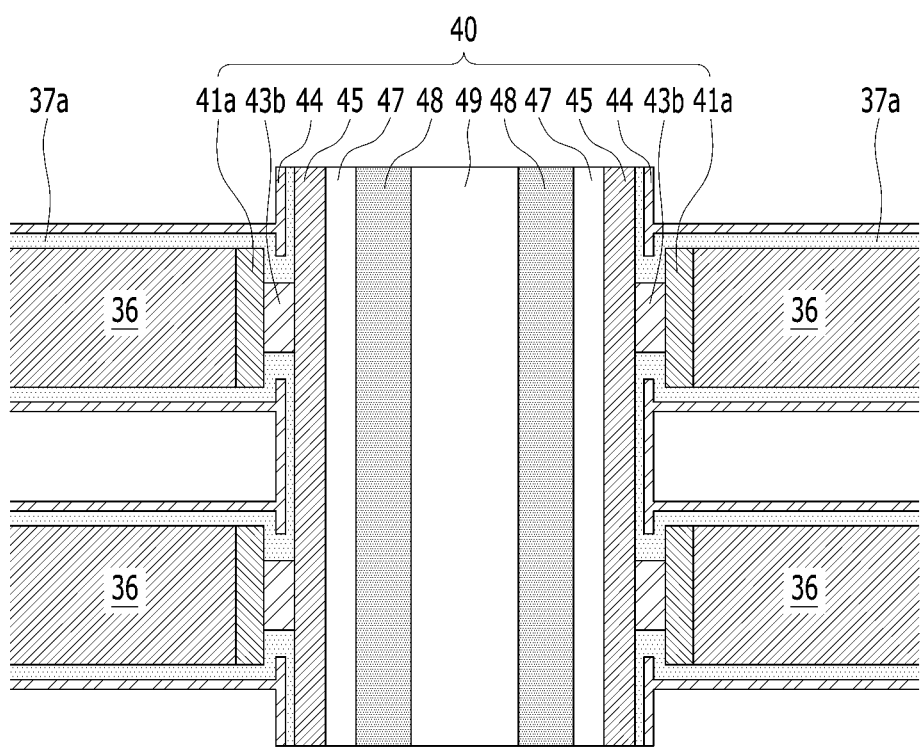

FIGS. 15 and 16 illustrate a method of fabricating a 3D semiconductor device in accordance with another embodiment of the present disclosure. Referring to FIG. 15, the method of fabricating a 3D semiconductor device in accordance with this embodiment of the present disclosure may further include forming the outer interlayer dielectric layer 37*a* by performing a deposition process in addition to performing the processes described earlier with reference to FIGS. 4 to 9 and 13. The forming of the outer interlayer dielectric layer 37*a* may include forming it in the form of a liner on the surfaces of the word line 36, the confined blocking dielectric layer 41*a*, the confined outer charge trap layer 43*b*, and the inner charge trap layer 45 by performing a conformal deposition process such as Atomic Layer Deposition (ALD). The outer interlayer dielectric layer 37*a* may include at least one of SiN, SiCN, SiBN, SiON, SiCON, and SiBCN (or a combination thereof). The outer interlayer dielectric layer 37*a* may partially fill the undercut region U.

Referring to FIG. 16, the method may further include conformally forming the edge charge trap layer 44 over the outer interlayer dielectric layer 37*a*. The edge charge trap layer 44 may include a high-k dielectric material, such as silicon nitride (SiN).

Subsequently, the method may further include forming a 3D semiconductor device including the inner interlayer dielectric layer 37*b*, the confined blocking dielectric layer 41*a*, the more confined outer charge trap layer 43*b*, the edge charge trap layer 44, and the confined inner charge trap layer 45*a* shown in FIG. 2E by performing the processes described earlier with reference to FIGS. 10A, 10B, and 11.

Figure 17:
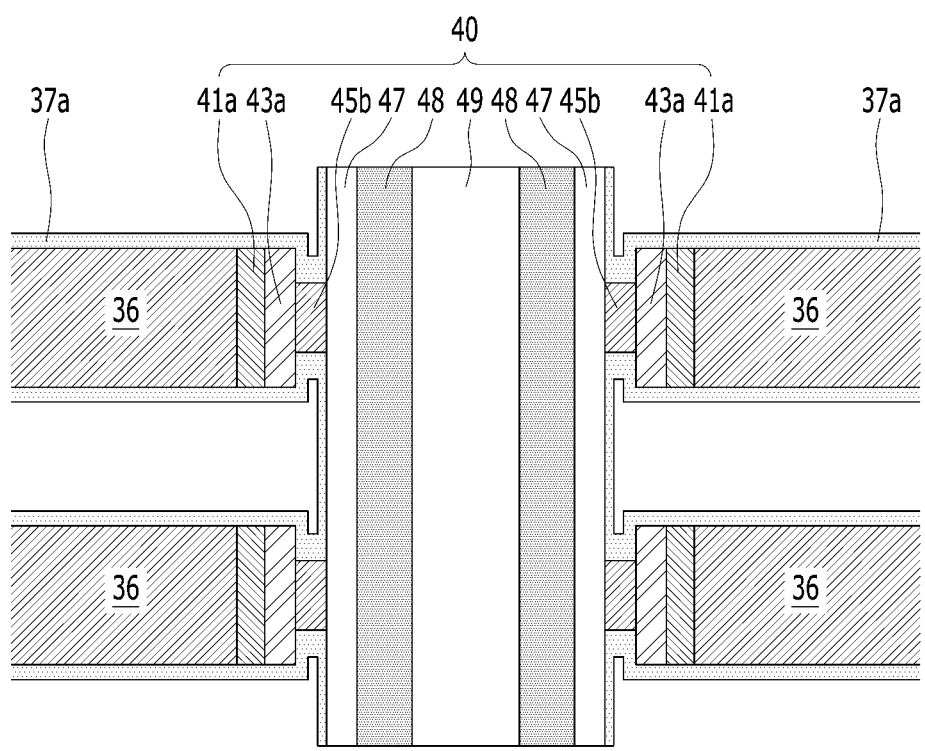
Figure 18:
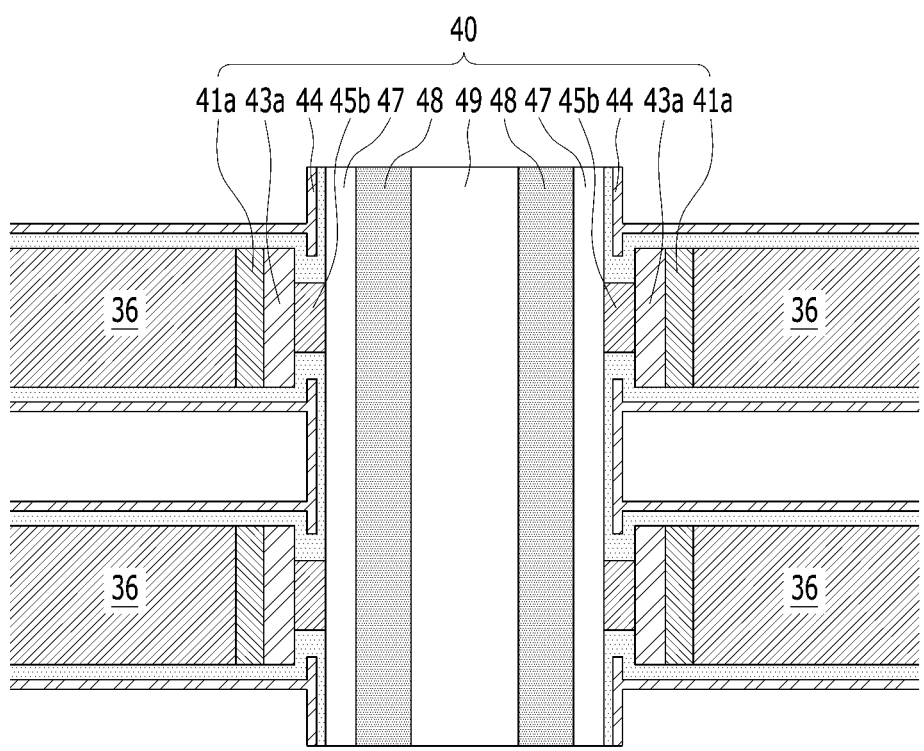

FIGS. 17 and 18 illustrate a method of fabricating a 3D semiconductor device in accordance with still another embodiment of the present disclosure. Referring to FIG. 17, the method of fabricating a 3D semiconductor device in accordance with this embodiment of the present disclosure may further include forming a liner layer 37*a* by performing a deposition process in addition to performing the processes described earlier with reference to FIGS. 4 to 9 and 14. The liner layer 37*a* may be conformally formed on the surfaces of the word line 36, the confined blocking dielectric layer 41*a*, the confined outer charge trap layer 43*b*, and the confined inner charge trap layer 45*b*. The liner layer 37*a* may include silicon carbon nitride (SiCN). The liner layer 37*a* may partially fill the undercut region U.

Referring to FIG. 18, the method may further include conformally forming the edge charge trap layer 44 over the liner layer 37*a*. Subsequently, the method may further include fabricating a 3D semiconductor device including the confined blocking dielectric layer 41*a*, the confined outer charge trap layer 43*a*, and the edge charge trap layer 44, and the more confined inner charge trap layer 45*b* shown in FIG. 2F by performing the processes described earlier with reference to FIGS. 10A, 10B, and 11.

Figure 19A:
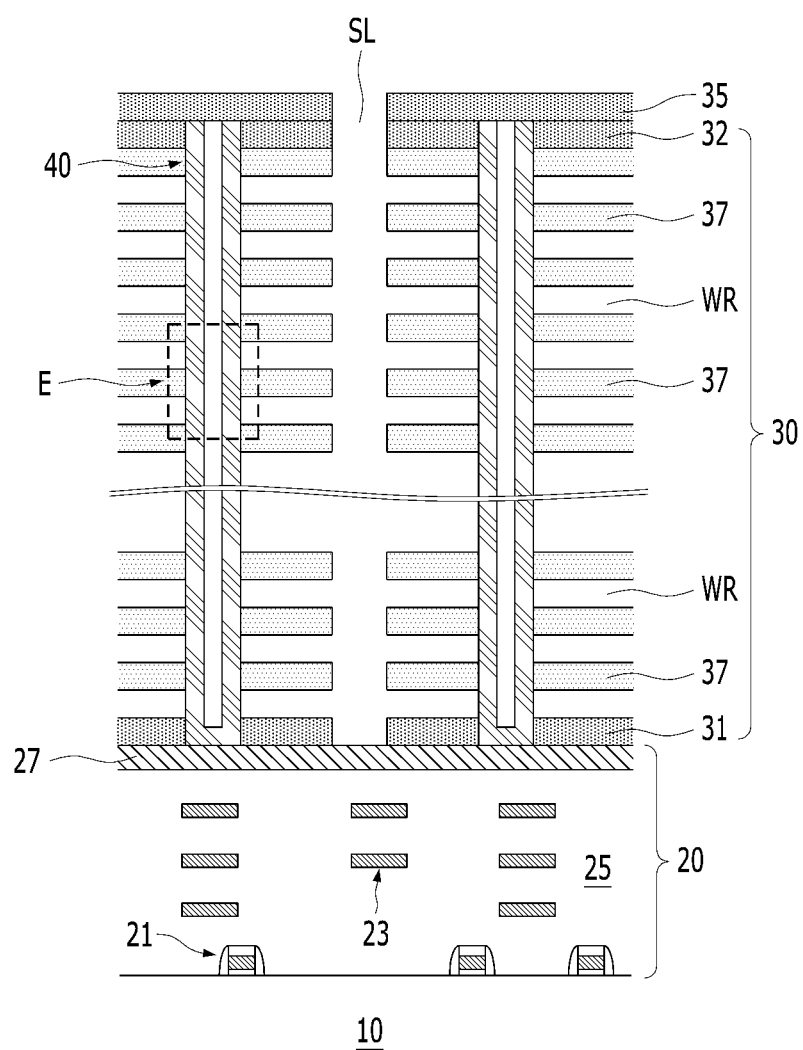
Figure 19B:
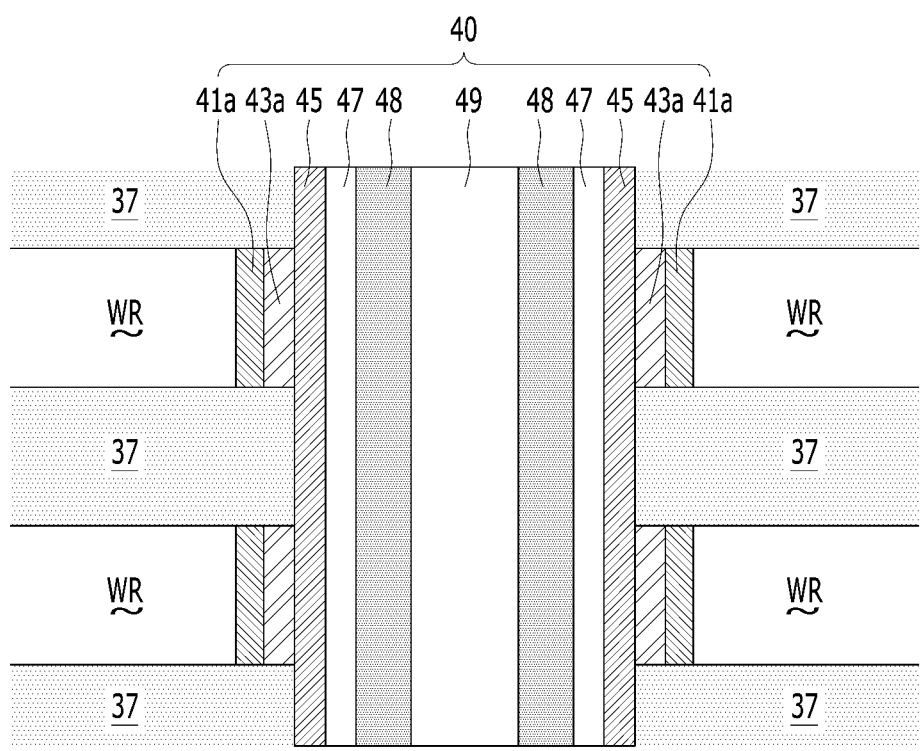
Figure 20:
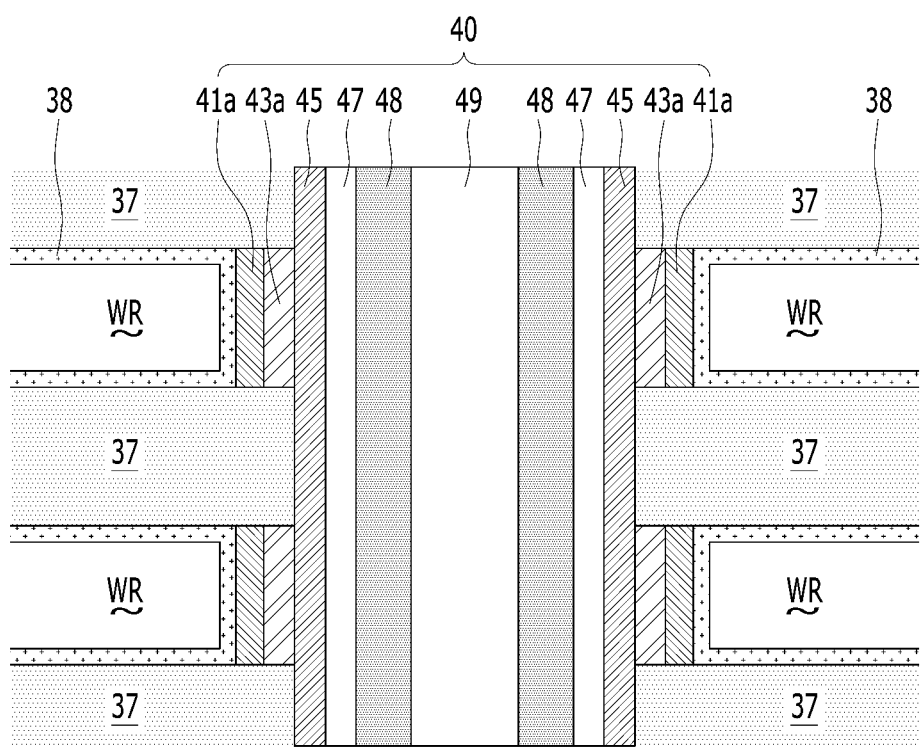

FIGS. 19A, 19B, and 20 illustrate a method of fabricating a 3D semiconductor device in accordance with yet another embodiment of the present disclosure. FIG. 19A illustrates forming a word line recess WR. FIG. 19B is an enlarged view of an area E shown in FIG. 19A. Referring to FIGS. 19A and 19B, the method of fabricating a 3D semiconductor device in accordance with this embodiment of the present disclosure may further include forming a word line recess WR by removing the word line 36 in addition to performing the processes described earlier with reference to FIGS. 4 to 10A and 10B. The method may further include removing the slit dielectric layer 51 (shown for example in FIG. 11) inside the slit SL and removing the word line 36 through the slit SL.

Referring to FIG. 20, the method may further include conformally forming the barrier layer 38 in the word line recess WR by performing a deposition process. The barrier layer 38 may include a barrier metal compound, such as for example TiN, Ti/TiN, TaN, or Ta/TaN (or a combination thereof) by performing a deposition process.

Subsequently, referring to FIG. 3, the method may further include forming a metal word line 36' by filling the word line recess WR with a metal.

According to various embodiments of the present disclosure, charge trap layers of a 3D semiconductor device may have improved charge trap capability and excellent retention.

The effects desired to be obtained in the embodiments of the present disclosure are not limited to the effects mentioned above, and other effects not mentioned above may also be clearly understood by those of ordinary skill in the art to which the present disclosure pertains from the description below.

While the present disclosure has been described with respect to the specific embodiments, it will be apparent to those skilled in the art that various changes and modifications may be made without departing from the spirit and scope of the invention as disclosed.

What is claimed is:

1. A three-dimensional (3D) semiconductor device, comprising:
    a word line stack over a substrate; and
    a channel pillar vertically penetrating the word line stack,
    wherein the word line stack includes a word line and an interlayer dielectric layer,
    wherein the channel pillar includes:
        a central dielectric layer;
        a cylinder-shaped channel layer surrounding a side surface of the central dielectric layer;
        a tunneling dielectric layer having a cylinder shape surrounding a side surface of the channel layer;
        an inner charge trap layer surrounding a side surface of the tunneling dielectric layer;
        a ring-shaped outer charge trap layer surrounding a side surface of the inner charge trap layer; and
        a ring-shaped blocking dielectric layer surrounding a side surface of the outer charge trap layer, and
    wherein:
        a vertical thickness of the word line is substantially the same as a vertical thickness of the blocking dielectric layer, and
        the interlayer dielectric layer is in contact with upper and lower surfaces of the outer charge trap layer and is in contact with upper and lower surfaces of the blocking dielectric layer, and
    wherein the interlayer dielectric layer includes a nitride material having a higher dielectric constant than a silicon oxide.

2. The 3D semiconductor device of claim 1, wherein a vertical thickness of the outer charge trap layer is substantially the same as the vertical thickness of the blocking dielectric layer.

3. The 3D semiconductor device of claim 2, wherein:
    the inner charge trap layer has a ring shape, and
    a vertical thickness of the inner charge trap layer is substantially the same as the vertical thickness of the outer charge trap layer.

4. The 3D semiconductor device of claim 2, wherein:
    the inner charge trap layer has a ring shape, and a vertical thickness of the inner charge trap layer is smaller than the vertical thickness of the outer charge trap layer.

5. The 3D semiconductor device of claim 4, wherein the interlayer dielectric layer includes an edge portion interposed between the outer charge trap layer and the channel layer to be adjacent to upper and lower surfaces of the inner charge trap layer.

6. The 3D semiconductor device of claim 5, wherein the interlayer dielectric layer further includes an edge charge trap layer interposed in the edge portion.

7. The 3D semiconductor device of claim 6, wherein the edge charge trap layer includes a dielectric material having a higher dielectric constant than the interlayer dielectric layer.

8. The 3D semiconductor device of claim 6, wherein the edge charge trap layer is conformally formed on surfaces of the word line and the channel pillar.

9. The 3D semiconductor device of claim 8, wherein the interlayer dielectric layer includes:
an outer interlayer dielectric layer between the edge charge trap layer and the channel pillar and between the edge charge trap layer and the word line; and
an inner edge charge trap layer over the edge charge trap layer on a surface of the word line.

10. The 3D semiconductor device of claim 2, wherein the inner charge trap layer has a cylinder shape.

11. The 3D semiconductor device of claim 10, wherein:
the outer charge trap layer includes at least one of high-k dielectric materials or oxide semiconductor materials, and
the inner charge trap layer includes at least one of silicon nitride based materials.

12. The 3D semiconductor device of claim 1, wherein a vertical thickness of the outer charge trap layer is smaller than the vertical thickness of the blocking dielectric layer.

13. The 3D semiconductor device of claim 12, wherein the interlayer dielectric layer includes an edge portion interposed between the blocking dielectric layer and the inner charge trap layer to be adjacent to the upper and lower surfaces of the outer charge trap layer.

14. The 3D semiconductor device of claim 13, wherein the interlayer dielectric layer further includes an edge charge trap layer interposed in the edge portion.

15. The 3D semiconductor device of claim 14, wherein the edge charge trap layer includes at least one of silicon nitride based materials.

16. The 3D semiconductor device of claim 1, wherein:
the blocking dielectric layer includes at least one of ZrOx, HfOx, HfON, $Al_2O_3$, $Y_2O_3$, LaOx, SrOx, and TiOx, and
the outer charge trap layer and the inner charge trap layer include high-k dielectric materials including at last one of ZrOx, HfOx, HfON, $Al_2O_3$, $Y_2O_3$, LaOx, SrOx, and TiOx, oxide semiconductor materials including at least one of IGZO (Indium Gallium Zinc Oxide), ZnO, ZTO (zinc-tin-oxide), $Ga_2O_3$, and $SnO_2$, at least one of SiN, SiBN, SiCN, SiON, and SiBCN, or a combination thereof, and
the outer charge trap layer and the inner charge trap layer include different materials.

17. The 3D semiconductor device of claim 1, wherein the interlayer dielectric layer includes at least one of SiN, SiBN, SiON, SiCN, SiCON, and SiBN.

18. A three-dimensional (3D) semiconductor device, comprising:
a word line stack over a substrate; and
a channel pillar vertically penetrating the word line stack,
wherein the word line stack includes a plurality of word lines and a plurality of interlayer dielectric layers that are stacked alternately,
wherein the channel pillar includes:
a central dielectric layer;
a cylinder-shaped channel layer surrounding a side surface of the central dielectric layer;
a cylinder-shaped tunneling dielectric layer surrounding a side surface of the channel layer;
a cylinder-shaped inner charge trap layer surrounding a side surface of the tunneling dielectric layer;
ring-shaped outer charge trap layers surrounding a side surface of the inner charge trap layer; and
ring-shaped blocking dielectric layers surrounding side surfaces of the outer charge trap layers, and
wherein vertical thicknesses of each of the word lines, each of the blocking dielectric layers, and each of the outer charge trap layers are substantially the same,
each of the interlayer dielectric layers is in contact with upper and lower surfaces of the outer charge trap layer and is in contact with the blocking dielectric layer,
each of the outer charge trap layers includes at least one of ZrOx, HfOx, HfON, $Al_2O_3$, $Y_2O_3$, LaOx, SrOx, TiOx, IGZO (Indium Gallium Zinc Oxide), ZnO, ZTO (zinc-tin-oxide), $Ga_2O_3$, and $SnO_2$, and
the inner charge trap layer includes at least one of SiN, SiCN, SiBN, SiON, SiCON, and SiBCN, and
wherein the interlayer dielectric layer includes a nitride material having a higher dielectric constant than a silicon oxide.

19. A three-dimensional (3D) semiconductor device, comprising:
a word line stack over a substrate; and
a channel pillar vertically penetrating the word line stack,
wherein the word line stack includes a plurality of word lines and a plurality of interlayer dielectric layers that are stacked alternately,
wherein the channel pillar includes:
a central dielectric layer;
a cylinder-shaped channel layer surrounding a side surface of the central dielectric layer;
a cylinder-shaped tunneling dielectric layer surrounding a side surface of the channel layer;
ring-shaped inner charge trap layers surrounding a side surface of the tunneling dielectric layer;
ring-shaped outer charge trap layers surrounding side surfaces of the inner charge trap layers; and
ring-shaped blocking dielectric layers surrounding side surfaces of the outer charge trap layers, and
wherein vertical thicknesses of each of the word lines, each of the blocking dielectric layers, each of the outer charge trap layers and each of the inner charge trap layers are substantially the same,
each of the interlayer dielectric layers is in contact with upper and lower surfaces of the outer charge trap layer and is in contact with the blocking dielectric layer,
each of the outer charge trap layers and each of the inner charge trap layers include one of high-k materials, oxide semiconductor materials, and silicon nitride, and
the outer charge trap layers and the inner charge trap layers include different materials, and wherein the interlayer dielectric layer includes a nitride material having a higher dielectric constant than a silicon oxide.

20. The 3D semiconductor device of claim 19, wherein:
the high-k material includes at least one of ZrOx, HfOx, HfON, $Al_2O_3$, $Y_2O_3$, LaOx, SrOx, and TiOx, and
the oxide semiconductor material includes at least one of IGZO (Indium Gallium Zinc Oxide), ZnO, ZTO (zinc-tin-oxide), $Ga_2O_3$, and $SnO_2$, and
the silicon nitride includes at least one of SiN, SiCN, SiBN, SiON, SiCON, and SiBCN.

* * * * *